(12) United States Patent
Nishio et al.

(10) Patent No.: US 7,760,531 B2
(45) Date of Patent: Jul. 20, 2010

(54) SEMICONDUCTOR MODULE

(75) Inventors: Yoji Nishio, Tokyo (JP); Seiji Funaba, Tokyo (JP); Yutaka Uematsu, Kawasaki (JP); Hideki Osaka, Kawasaki (JP)

(73) Assignee: Elpida Memory, Inc., Tokyo (JP)

( * ) Notice: Subject to any disclaimer, the term of this patent is extended or adjusted under 35 U.S.C. 154(b) by 995 days.

(21) Appl. No.: 11/511,262

(22) Filed: Aug. 29, 2006

(65) Prior Publication Data

US 2007/0047354 A1    Mar. 1, 2007

(30) Foreign Application Priority Data

Aug. 29, 2005    (JP) .............................. 2005-248023

(51) Int. Cl.
*G11C 5/02* (2006.01)
(52) U.S. Cl. ..................... 365/51; 365/149; 365/191; 365/214; 365/233.13
(58) Field of Classification Search ........... 365/51, 365/52, 63, 149, 189.09, 191, 198, 206, 214, 365/233.13
See application file for complete search history.

(56) References Cited

U.S. PATENT DOCUMENTS

| 5,642,323 | A | * | 6/1997 | Kotani et al. ............ 365/230.03 |
| 5,831,890 | A | * | 11/1998 | Selna et al. ................... 365/51 |
| 5,856,937 | A | * | 1/1999 | Chu et al. ..................... 365/51 |
| 6,646,945 | B1 | | 11/2003 | Lee et al. |
| 6,982,892 | B2 | * | 1/2006 | Lee et al. ....................... 365/63 |
| 7,447,038 | B2 | * | 11/2008 | Uematsu et al. ............. 361/748 |
| 2005/0030803 | A1 | * | 2/2005 | Forbes et al. ................ 365/202 |

* cited by examiner

*Primary Examiner*—Dang T Nguyen
*Assistant Examiner*—Alexander Sofocleous
(74) *Attorney, Agent, or Firm*—McDermott Will & Emery LLP

(57) ABSTRACT

A semiconductor module includes a first semiconductor device, a second semiconductor device and a reference voltage supplying circuit. The first semiconductor device includes a first electrode. The second semiconductor device includes a second electrode. The reference voltage supplying circuit is for supplying a reference potential to the first electrode and the second electrode and for suppressing a noise to be transferred between the first electrode and the second electrode.

18 Claims, 22 Drawing Sheets

SEMICONDUCTOR MODULE

BACKGROUND OF THE INVENTION

This invention relates to a semiconductor module with a plurality of semiconductor devices, especially a memory module with a plurality of memory chips such as a dynamic random access memory.

Each memory chip of a memory module refers a reference potential for deciding a logical value. Erroneous decisions of the memory chips are lead by a plurality of noises.

The reference potential of one of the memory chips is affected by first to third noises. The first noise is transmitted from other devices outside of the memory module. The second noise is generated by the memory chip itself. The third noise is generated by another one of the memory chip of the same memory module and transmits between the memory chips.

The first noise is depressed by a memory module comprising a low pass filter (LPF) between a system board. The memory module having the LPF is disclosed in U.S. Pat. No. 6,646,945.

The second noise is depressed by a memory module comprising a common reference electrode and a decoupling capacitor. The common reference electrode is extending in a plane parallel to a ground layer and supplies a reference potential to a plurality of memory chips directly. The decoupling capacitor is connected between the reference electrode and the ground layer.

SUMMARY OF THE INVENTION

The third noise still exist. Therefore, it is an object of the present invention to provide a semiconductor module which suppresses the noise being generated by the semiconductor device and transmitting between the semiconductor devices.

It is another object of the present invention to provide a semiconductor module which suppresses the noise larger amount in a high frequency region than in a low frequency region.

According to an aspect of the present invention, there is provided a semiconductor module comprises a first semiconductor device, a second semiconductor device and a reference voltage supplying circuit. The first semiconductor device comprises a first electrode. The second semiconductor device comprises a second electrode. The reference voltage supplying circuit is for supplying a reference potential to the first electrode and the second electrode and for suppressing a noise to be transferred between the first electrode and the second electrode.

These and other objects, features and advantages of the present invention will become more apparent upon reading of the following detailed description along with the accompanied drawings.

DESCRIPTION OF PREFERRED EMBODIMENTS

Figure 1:
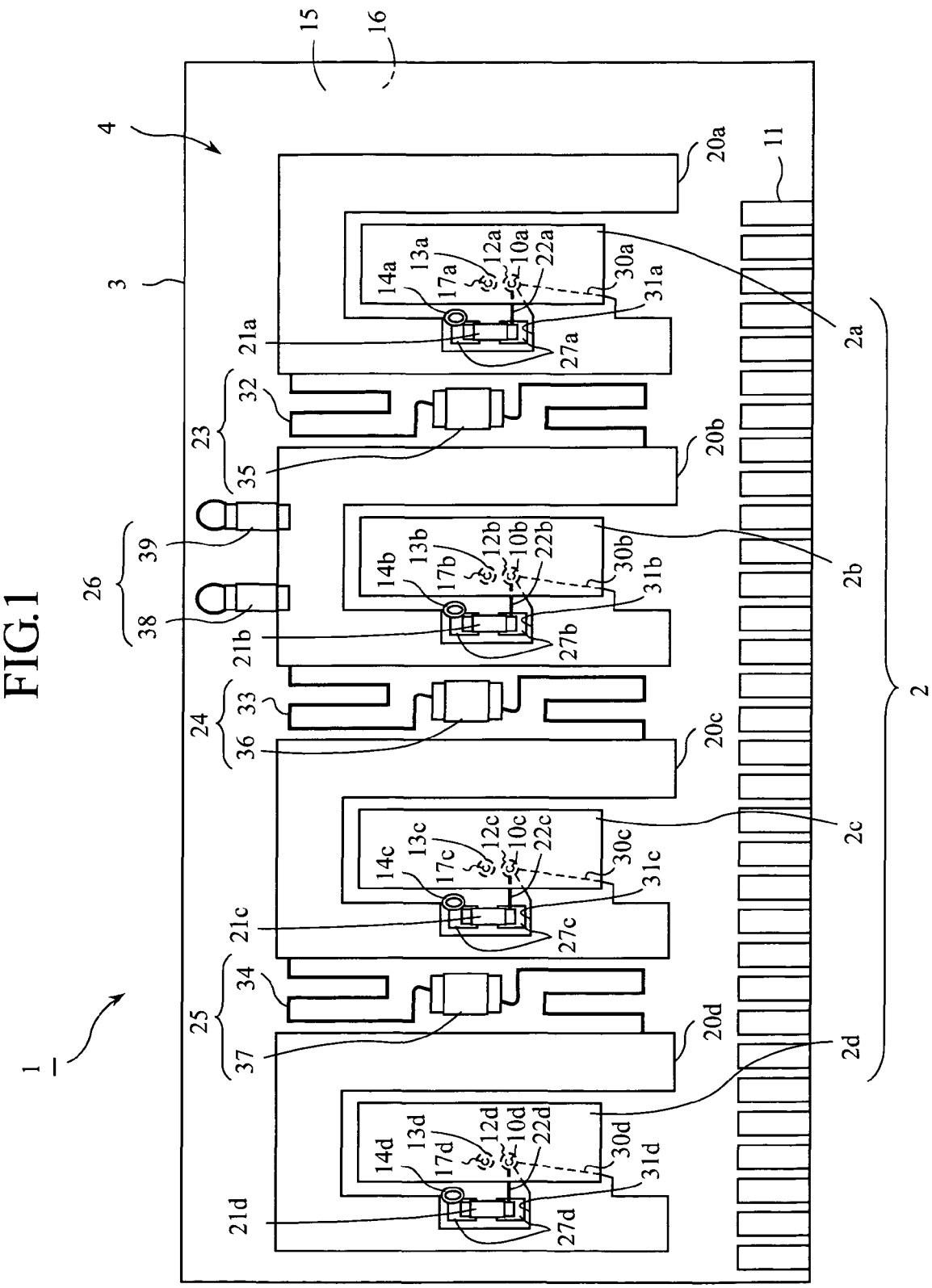
FIG. 1 is a plan view of a memory module of a first embodiment of the present invention.

FIG. 1 is a plan view of a memory module 1 of a first embodiment of this invention. Referring to FIG. 1, the memory module 1 comprises a group of memory chips 2, a module board 3 and a reference voltage supplying circuit 4.

The group of memory chip 2 comprises first to fourth memory chips 2a to 2d. The first to fourth memory chips 2a to 2d comprises first to fourth reference pins 10a to 10d and first to fourth ground pins 17a to 17d. The group of memory chips 2 may comprise five or more memory chips and may comprises three or less memory chips.

The module board 3 comprises a front side surface 15, a back side surface 16, a ground layer, a power supply layer and a plurality of connecting pins 11. The module board 3 comprises first to fourth reference pads 12a to 12d, first to fourth ground pads 13a to 13d and first to fourth ground via holes 14a to 14b. Each of the front side surface 15 and the back side surface 16 has a rectangular shape and has an upper and lower long sides and left and right short sides. The ground layer and the power supply layer are arranged between the front side surface 15 and the back side surface 16. The ground layer has a ground potential VSS. The supply layer has a power supply potential Vdd.

The plurality of connecting pins 11 are aligned parallel to each other on the lower longer side of the front side surface 15. The plurality of connecting pins 11 are to be inserted in a system board such as a mother board of a computer. The plurality of connecting pins 11 receive the ground potential VSS and the power supply potential Vdd from the system board and transmit the ground potential and the power supply potential to the ground layer and the power supply layer, respectively. The plurality of connecting pins 11 input/output a plurality of signals.

The first to fourth memory chips 2a to 2d are aligned on the front side surface 15 to be equally spaced along the lower and upper long sides. All of or a part of the first to fourth memory chips 2a to 2d may arranged on the back side surface 16.

The first to fourth reference pads 12a to 12d are in contact with the first to fourth reference pins 10a to 10d, respectively. The first to fourth ground pads 13a to 13d are in contact with the first to fourth ground pins 17a to 17d, respectively. The first to fourth ground pads 13a to 13d are connected to the ground layer. The first to fourth ground via holes 14a to 14d are connected to the ground layer.

On the front side surface 15, the reference voltage supplying circuit 4 comprises first to fourth reference electrodes 20a to 20d, first to fourth decoupling capacitors 21a to 21d, first to fourth lines 22a to 22d, first to third connection portions 23 to 25, a Thevenin termination portion 26 and first to fourth pairs of pads 27a to 27d.

The first to fourth reference electrodes 20a to 20d are angular wide U-shaped plates and are arranged in parallel with the ground layer and the power supply layer. The first to fourth reference electrodes 20a to 20d have a same shape. The first to fourth reference electrodes 20a to 20d may be other shapes of plates. The first to fourth reference electrodes 20a to 20d surround the first to fourth memory chips 2a to 2d, the first to fourth reference pad 12a to 12d and the first to fourth ground pad 13a to 13d, respectively. The U-shape of the first to fourth reference electrodes 20a to 20d have openings directed to the lower longer side of the module board 3.

The first to fourth reference electrodes 20a to 20d comprises first to fourth projection portions 30a to 30d and first to fourth depression portions 31a to 31d, respectively. The first to fourth projection portions 30a to 30d are extending from left-hand inner sides of the U-shapes to the first to fourth reference pads 12a to 12d, respectively. The first to fourth projection portions 30a to 30d are arranged between the openings of the U-shapes and the first to fourth depression portions 31a to 31d. The first to fourth depression portions 31a to 31d depressed from the left-hand inner sides of the U-shapes of the first to fourth reference electrode 20a to 20d, respectively.

The first to fourth reference electrode 20a to 20d are arranged to be equally spaced. The first to fourth reference electrode 20a to 20d forms a multi-divided pattern.

The first to fourth pairs of pads 27a to 27d are arranged in the first to fourth depression portion 31a to 31d, respectively.

The first to fourth lines 22a to 22d connect the first to fourth reference parts 12a to 12d with the first to fourth pairs of pads 27a to 27d, respectively. The first to fourth lines 22a to 22d connect the first to fourth ground via holes 14a to 14d with the first to fourth pairs of pads 27a to 27d, respectively. The first to fourth lines 22a to 22d may be made of the first to fourth reference electrode 20a to 20d, respectively.

The first to fourth decoupling capacitors 21a to 21d are mounted on the first to fourth pairs of pads 27a to 27d, respectively. Then, the first to fourth decoupling capacitors 21a to 21d is connected between the first to fourth reference electrodes 20a to 20d and the ground layer. The first to fourth decoupling capacitors 21a to 21d have a same profile. The first to fourth decoupling capacitors 21a to 21d may be composed of a plurality of capacitors.

The first to third connection portions 23 to 25 comprises first to third inductors 32 to 34 and first to third resistors 35 to 37. The first to third inductors 32 to 34 are made of line patterns on a printed circuit board. The first inductor 32 is connected between an upper portion of a left-hand outer side of the first reference electrode 20a and a lower portion of a right-hand outer side of the second reference electrode 20b. The second inductor 33 is connected between an upper portion of a left-hand outer side of the second reference electrode 20b and a lower portion of a right-hand outer side of the third reference electrode 20c. The third inductor 34 is connected between an upper portion of a left-hand outer side of the third reference electrode 20c and a lower portion of a right-hand outer side of the fourth reference electrode 20c. The first to third resistors 35 to 37 is inserted into the pathway of the first to third inductor 35 to 37 in series.

The first to third resistor 35 to 37 have a same resistance value. In this embodiment, the first to third connection portions 23 to 25 have a same value of resistance 100Ω.

The first to third inductors 32 to 34 made of a trace and have a same meander line shape. The meander line shape is composed of a line bended at a plurality of points. The first to third inductor 32 to 34 are microstrip lines and have an same inductance $L_{line}$. The inductance $L_{line}$ is roughly given by $L_{line} = \mu_0 d/w$. The first to third inductors 32 to 34 have a length 1 of 16 mm and a width w of 0.1 mm. A distance d between the first to third inductor 32 to 34 and the ground layer is 0.1 mm. The space permeability $\mu_0$ is $4\pi*10^{-7} (N/A^2)$. Then the $L_{line}$ is 1.25 nH/mm.

The Thevenin termination portion 26 comprises a first and second termination resistor 38 and 39. The first termination resistor 38 is connected between the second reference electrode 20b and the ground layer. The second termination resistor 39 is connected between the second reference electrode 20b and the power supply layer. The Thevenin termination portion 26 makes a reference potential from the VSS of the ground layer and the Vdd of the power supply layer. The reference potential transmits to all of the first to fourth reference electrodes 20a to 20d. The reference potential may be supplied by a mother board or by a switching regulator in the memory module 1.

Figure 2:
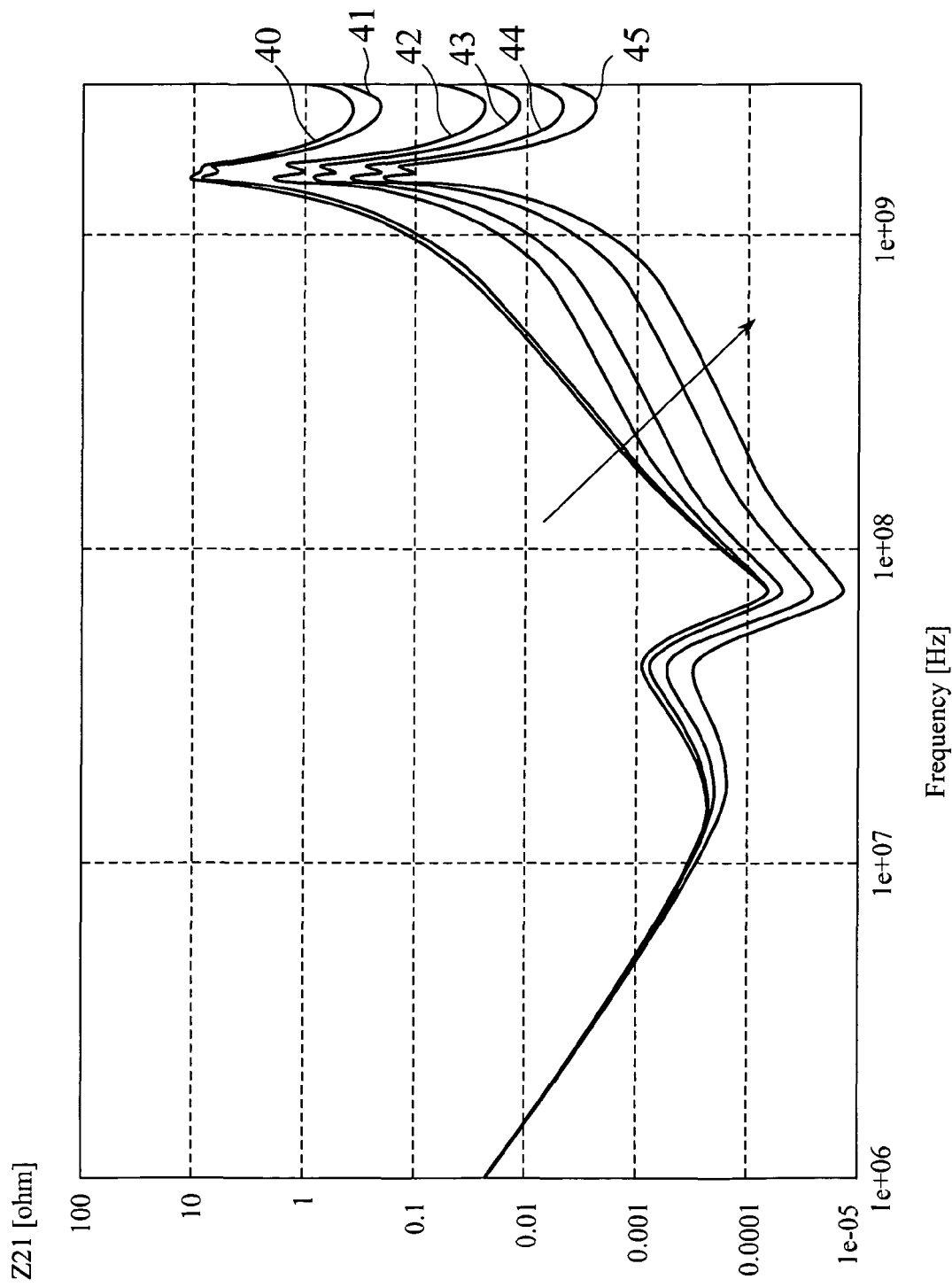
FIG. 2 is frequency characteristics of the memory module of FIG. 1.

FIG. 2 shows frequency characteristics of transfer impedances $Z_{21}$ between the first memory chip 2a and the second memory chip 2b. A frequency characteristic of a transfer impedance $Z_{32}$ between the second memory chip 2b and the third memory chip 2c and a frequency characteristic of a transfer impedance $Z_{43}$ between the third memory chip 2c and the fourth memory chip 2d has the same frequency characteristic of the transfer impedance $Z_{21}$.

Referring to FIG. 2, lines 40 to 45 illustrates frequency characteristics of transfer impedances $Z_{21}$ under the condition that inductances L of the first inductor 32 are 1 nH, 10 nH, 100 nH, 200 nH, 500 nH, 1000 nH, respectively.

The transfer impedance $Z_{21}$ is given by $Z_{21} = V_2/I_1$ where $I_1$ is an input current at the first reference pin 10a and $V_2$ is an potential at the second reference pin 10b upon applying the input current $I_1$.

Maximum values of lines 40 to 45 are appeared in a frequency region more than 1 GHz. The multi-divided pattern causes the appearance of the maximum values in the extremely high frequency region. If a single plane electrode serving as the first to fourth reference electrodes 20a to 20d is not divided, a frequency characteristic of a transfer impedance $Z_{21}$ has a maximum value in a lower frequency region than the memory module 1 of this embodiment.

This semiconductor module 1 of the first embodiment comprises a first circuit, a second circuit and a third circuit. The first circuit comprises the first reference electrode 20a and the first decoupling capacitor 21a. The first circuit has a first anti-resonant frequency. The second circuit comprises the second reference electrode 20b and the second decoupling capacitor 21b. The second circuit has a second anti-resonant frequency. The third circuit comprises the first and second reference electrode 20a and 20b, the first and second decoupling capacitor 21a and 21b, the first connection portion 23. The third circuit has a third anti-resonant frequency. Because, the first anti-resonant frequency and the second anti-resonant frequency are approximately same, the maximum value is appeared at the third anti-resonant frequency.

The higher inductance of the first inductor 32 causes the lower transform $Z_{21}$ impedance in all frequency region. The transfer impedance more largely changes in a higher frequency region than in a lower frequency region depending on the inductance of the first inductor 32. The lower the equivalent series inductance (ESL) of the first connection portion 23 is, the lower the transfer impedance $Z_{21}$ is. The lower the transfer impedance $Z_{21}$ is, the less the noise transmits between the first memory chip 2a and the second memory chip 2b.

Preferably, the inductance of the first inductor 32 is ten times or more of an ESL of the first decoupling capacitor 21a so that the noise is suppressed. Considering inductances of the first and second reference electrode 20a and 20b and the first and second decoupling capacitor 21a and 21b, preferably, the inductance of the first inductor 32 is 10 nH or more. The length of the first inductor 32 is 16 mm or more so that the inductance of the first inductor 32 is 10 nH or more. If the first inductor 32 has a width of 0.1 mm or less, a ratio of width to height is 1 to 100 or more so that the length of the inductor 32 is 10 mm or more. Considering a mountain area, preferably, the width of the first inductor 32 is 0.2 mm or less, and more preferably, the width of the first inductor 32 is 0.1 mm or less.

The memory module 1 may comprise a plurality of groups of reference electrodes, wherein the reference electrodes in each of the groups are connected by connection portion.

Figure 3:
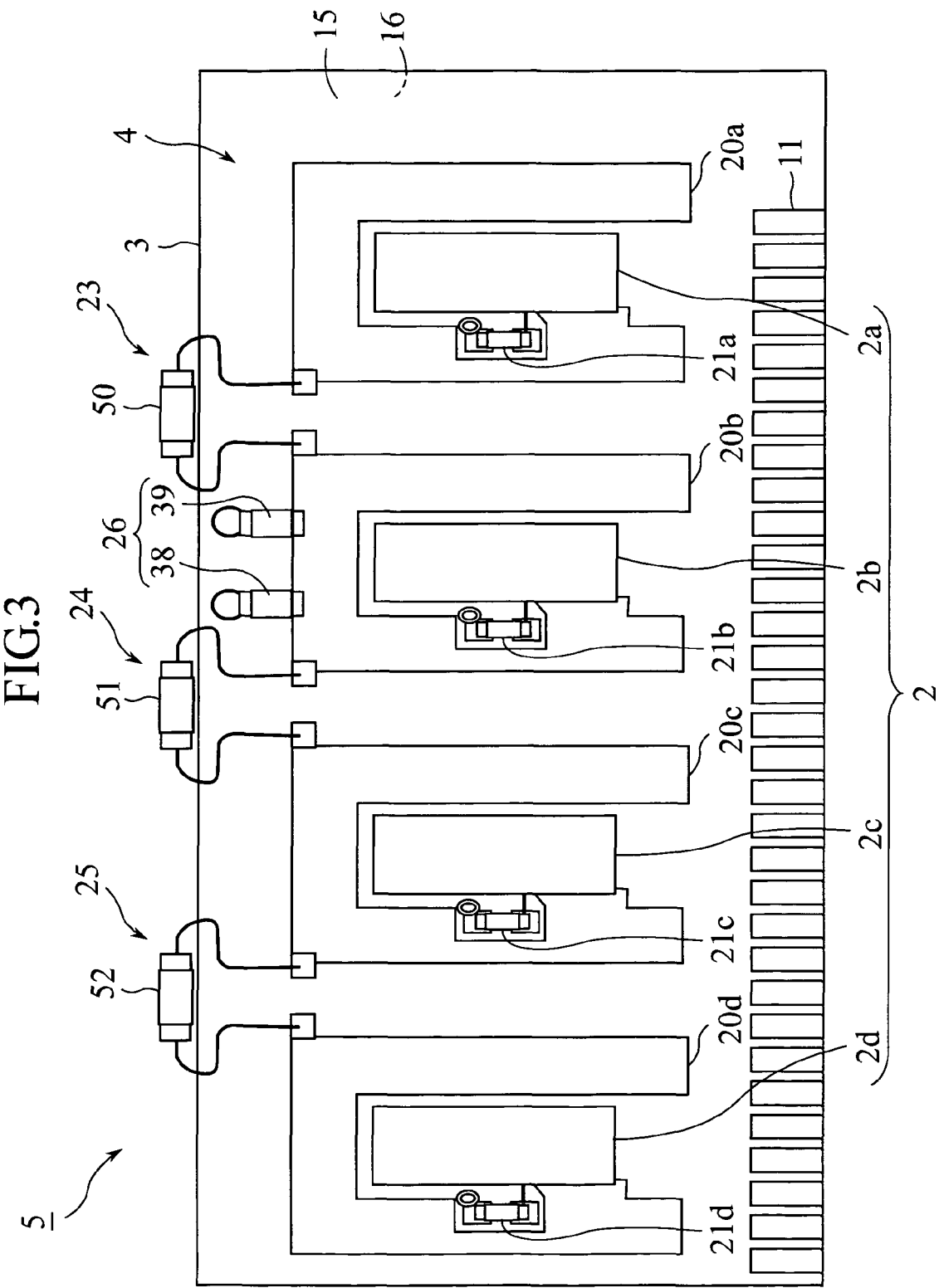
FIG. 3 is a plan view of a memory module comprising long-legged resistors.

FIG. 3 is a plan view of a memory module 5 of a second embodiment of this invention. Referring to FIG. 3, the memory module 5 of the second embodiment comprises a first to third long-legged resistors 50 to 52 instead of the first to third inductor 32 to 34 and the first to third resistor 35 to 37 in the memory module 1 of the first embodiment. The first to third long-legged resistors 50 to 52 comprises a resistor and two long lines for connecting the resistor.

The first long-legged resistor 50 is connected between an upper portion of a left-hand outer side of the first reference electrode 20a and an upper portion of a right-hand outer side of the second reference electrode 20b by the long legs. The second long-legged resistor 51 is connected between an upper portion of a left-hand outer side of the second reference electrode 20b and an upper portion of a right-hand outer side of the third reference electrode 20c. The third long-legged resistor 52 is connected between an upper portion of a left-hand outer side of the third reference electrode 20c and an upper portion of a right-hand outer side of the fourth reference electrode 20d.

The first to third long-legged resistors 50 to 52 have the same equivalent series inductance which is ten times or more of that of the first decoupling capacitor 21a. Preferably, in this embodiment, the first to third long-legged resistors 50 to 52 have equivalent series inductances of 10 nH or more.

Figure 4:
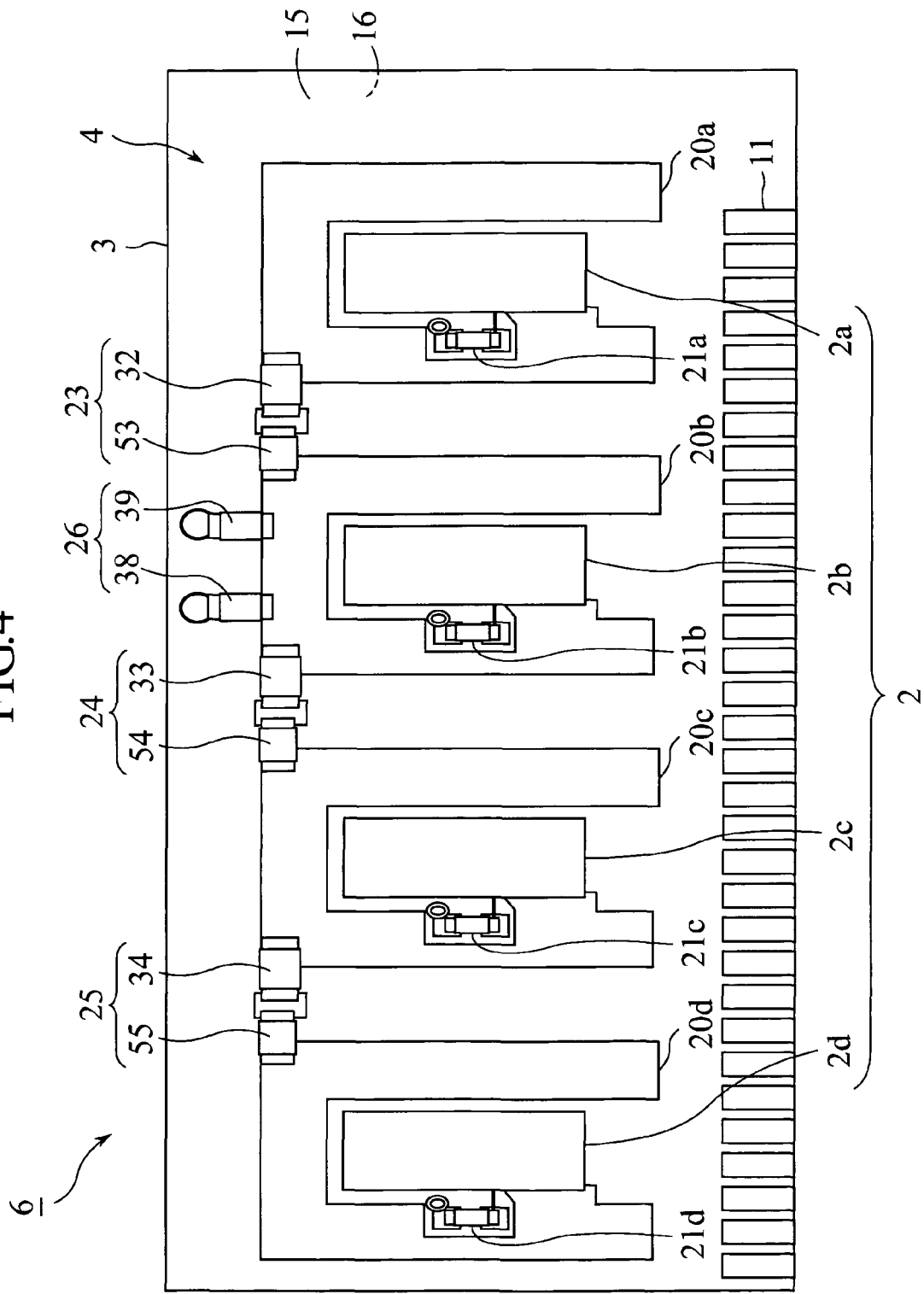
FIG. 4 is a plan view of a memory module comprising connection portions having chip inductors.

FIG. 4 is a plan view of a memory module 6 of a third embodiment of this invention. Referring to FIG. 4, the memory module 6 of the third embodiment comprises a first to third chip inductor 53 to 55 instead of the first to third inductor 32 to 34 in the memory module 1 of the first embodiment.

The first resistor 32 and the first chip inductor 53 are connected between an upper portion of a left-hand outer side of the first reference electrode 20a and an upper portion of a right-hand outer side of the second reference electrode 20b in series. The second resistor 33 and the second chip inductor 54 are connected between an upper portion of a left-hand outer side of the second reference electrode 20b and an upper portion of a right-hand outer side of the third reference electrode 20c in series. The third resistor 34 and the third chip inductor 55 is connected between an upper portion of a left-hand outer side of the third reference electrode 20c and an upper portion of a right-hand outer side of the third reference electrode 20d in series.

The first to third chip inductors 53 to 55 have a same equivalent series inductance which is ten times or more of the inductance of the first to third decoupling capacitor 21a to 21d. Preferably, in this embodiment, the equivalent series inductance of the first to third chip inductors 53 to 55 are 10 nH or more.

Figure 5:
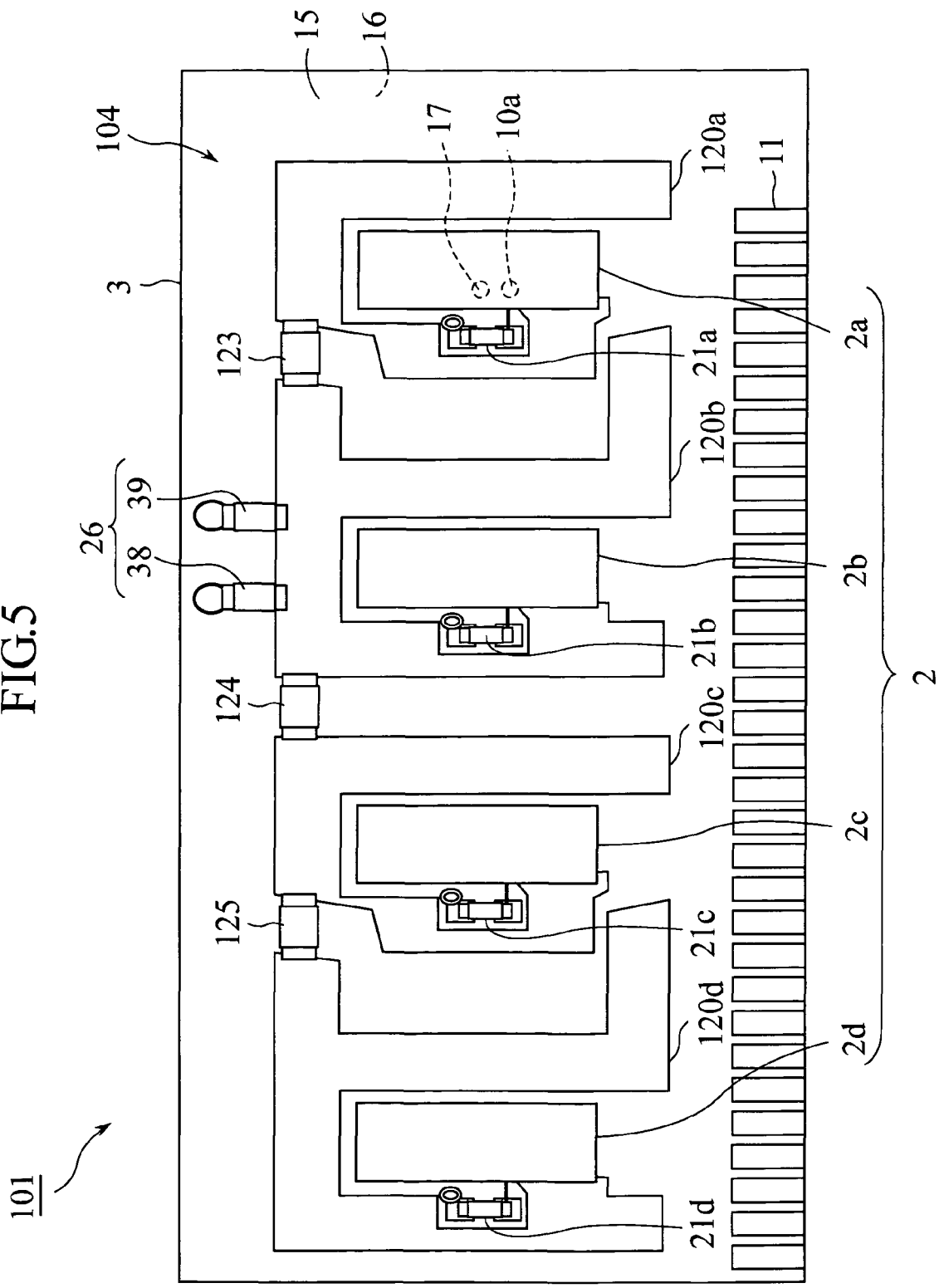
FIG. 5 is a plan view of a memory module comprising two types of areas
Figure 6:
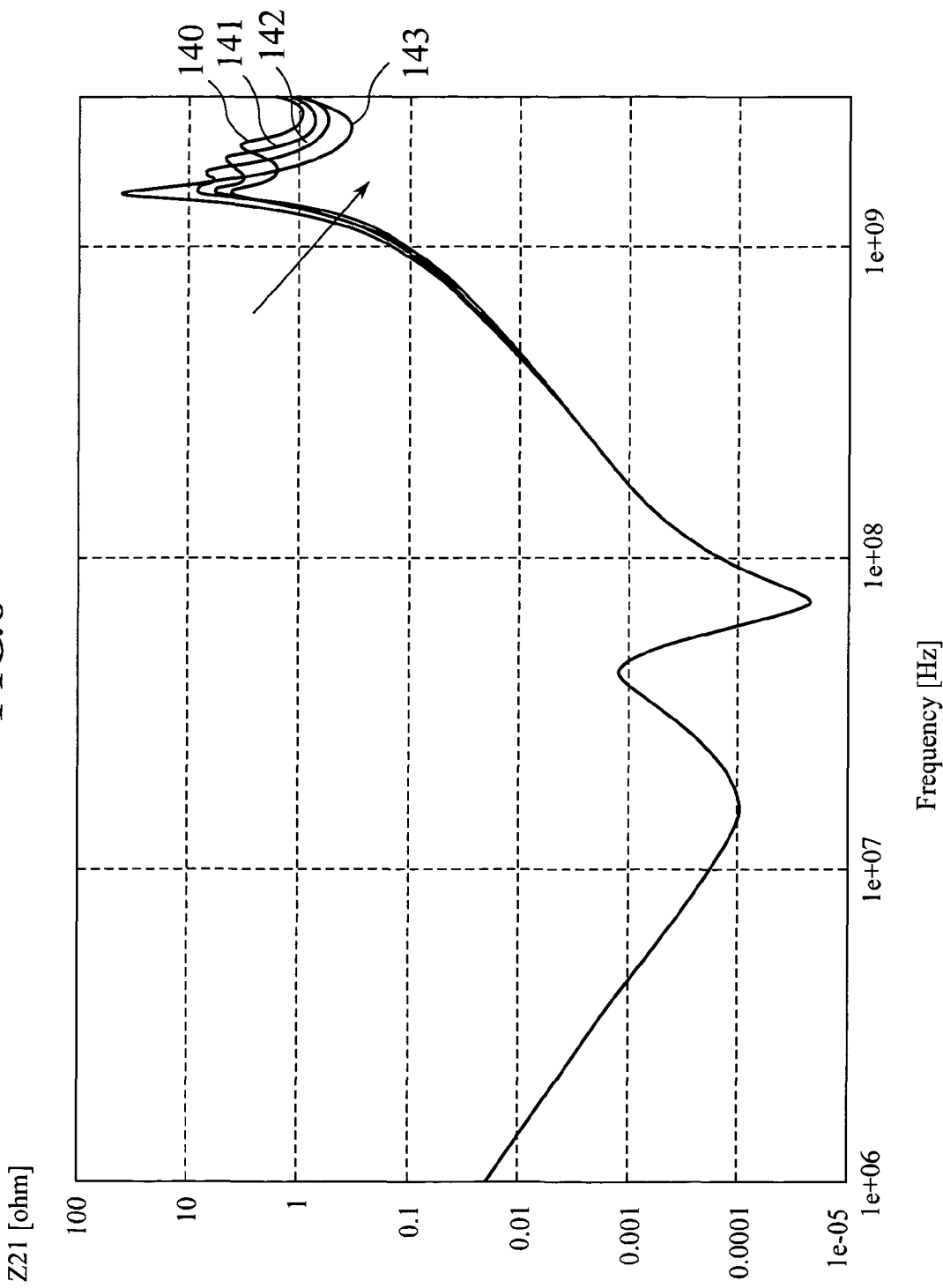
FIG. 6 is frequency characteristics of the memory module of FIG. 5.

FIG. 5 is a plan view of a memory module 104 of a fourth embodiment of the present invention. Referring to FIG. 5, the memory module 104 comprises a first to fourth reference electrode 120a to 120d instead of the first to fourth reference electrode 20a to 20d in the memory module 1 of the first embodiment. The memory module 101 comprises a first to third connection portion 123 to 125 instead of the first to fourth connection portion 23 to 25.

The first and third reference electrode 120a and 120c have a same shape which comprise depression portions at an upper left corner of the first and third reference electrode 20a and 20c of the first embodiment along the front side surface 15, respectively, and shorten an left-hand lower end of the first and third reference electrode 20a and 20c of the first embodiment, respectively. The second and fourth reference electrode 120b and 120d have a same shape which has an elongated portions elongated toward the right direction from an upper right-hand side and a lower right-hand side of the first and fourth reference electrode 20b and 20d of the first embodiment.

An area of the first and third reference electrode 120a and 120c differs by 10% from an area of the second and fourth reference electrode 120b and 120d. The ground layer and the first reference electrode 120a have a capacitance $C_{p11}$ therebetween. The ground layer and the third reference electrode 120c have the same capacitance $C_{p11}$. The ground layer and the second reference electrode 120b have a capacitance $C_{p12}$ therebetween. The ground layer and the fourth reference electrode 120d have the same capacitance $C_{p12}$. Because the area of the first and third reference electrode 120a and 120c is different from the area of the second and fourth reference electrode 120b and 120d, the capacitance $C_{p12}$ is different from the capacitance $C_{p11}$. In this embodiment, the capacitance $C_{p11}$ is 10 pF. The capacitance $C_{p12}$ is 30 pF.

The first to third connection portions 123 to 125 are made of resistors. The first to third connection portions have a same resistance of 100Ω. The first connection portion 123 is connected between the first reference electrode 120a and the second reference electrode 120b. The second connection portion 124 is connected between the second reference electrode 120b and the third reference electrode 120c. The third connection portion 125 is connected between the third reference electrode 120c and the fourth reference electrode 120d.

Figure 8:
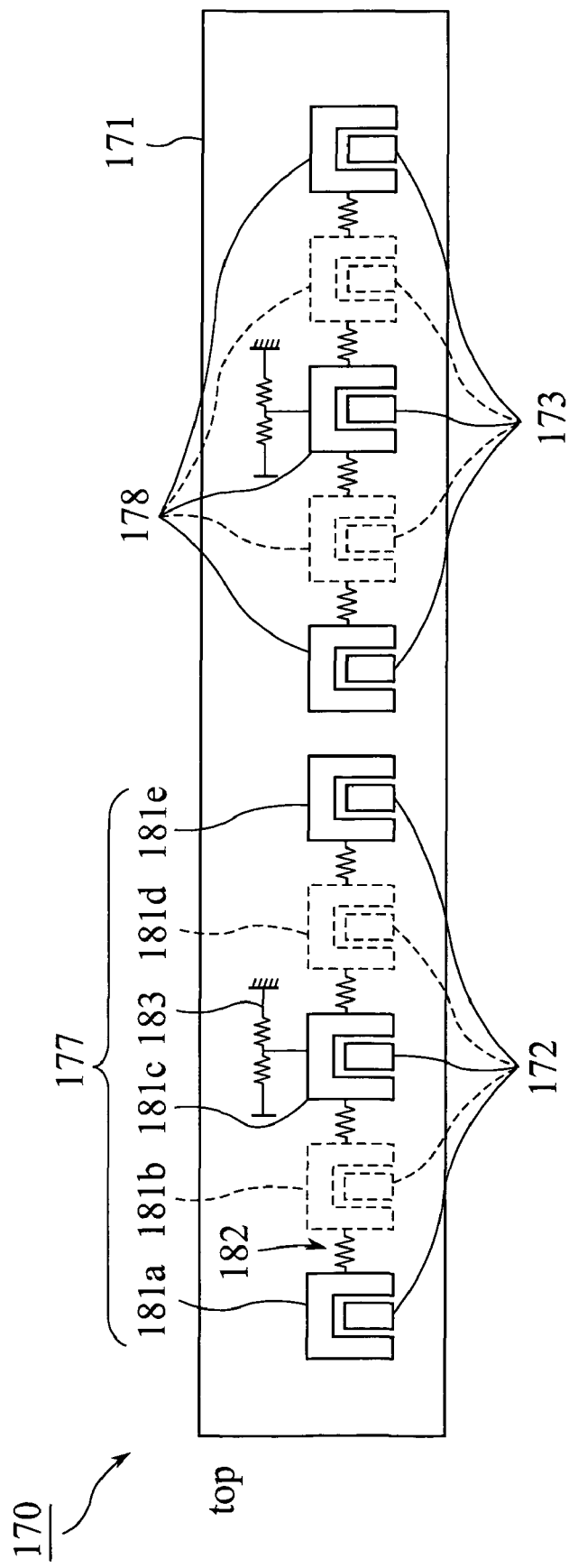
FIG. 8 is a plan view of the top portion of FIG. 7.

FIG. 8 shows frequency characteristics of a transfer impedances $Z_{21}$ between the first memory chip 2a and the second memory chip 2b of the fourth embodiment. A frequency characteristic of a transfer impedance $Z_{32}$ between the second memory chip 2b and the third memory chip 2c and a frequency characteristic of a transfer impedance $Z_{43}$ between the third memory chip 2c and the fourth memory chip 2d has the same frequency characteristic of the transfer impedance $Z_{21}$.

Lines 140 to 143 illustrates frequency characteristics of transfer impedance $Z_{21}$ under the condition that the capacitance $C_{p12}$ is 30 pF and the capacitance $C_{p11}$ changes in 10 pF, 15 pF, 20 pF and 30 pF, respectively. Maximum values of lines 140 to 143 are appeared in a frequency region more than 1 GHz.

This semiconductor module 1 of the fourth embodiment comprises a first circuit, a second circuit and a third circuit. The first circuit of the fourth embodiment comprises the first reference electrode 120a and the first decoupling capacitor 121a. The first circuit has a first anti-resonant frequency. The second circuit comprises the second reference electrode 120b and the second decoupling capacitor 121b. The second circuit has a second anti-resonant frequency.

The smaller the capacitance $C_{p12}$ is, the lower the maximum value of the transfer impedance $Z_{21}$ in a frequency region more than 1 GHz is. Because the first anti-resonant frequency is the same as the second anti-resonant frequency, the line 143 has a higher maximum value than the lines 140 to 142.

Because the first to fourth reference electrodes 120a to 120d have a feeding surface which has a low resistance and a high quality factor (Q), preferably, the first anti-resonant frequency differs by 5% of a basic frequency of the anti-resonance from the second anti-resonant frequency.

An anti-resonant frequency is given by $f=1/(2\pi(LC)^{1/2})$ where the C is capacitance and the L is inductance. Preferably, a difference between the area of the first reference electrode 120a and the area of the second reference electrode 120b is 10% of the area of the first reference electrode 120a so that the first anti-resonant frequency differs by 5% of the basic frequency of the anti-resonance from the second anti-resonant frequency.

Figure 7:
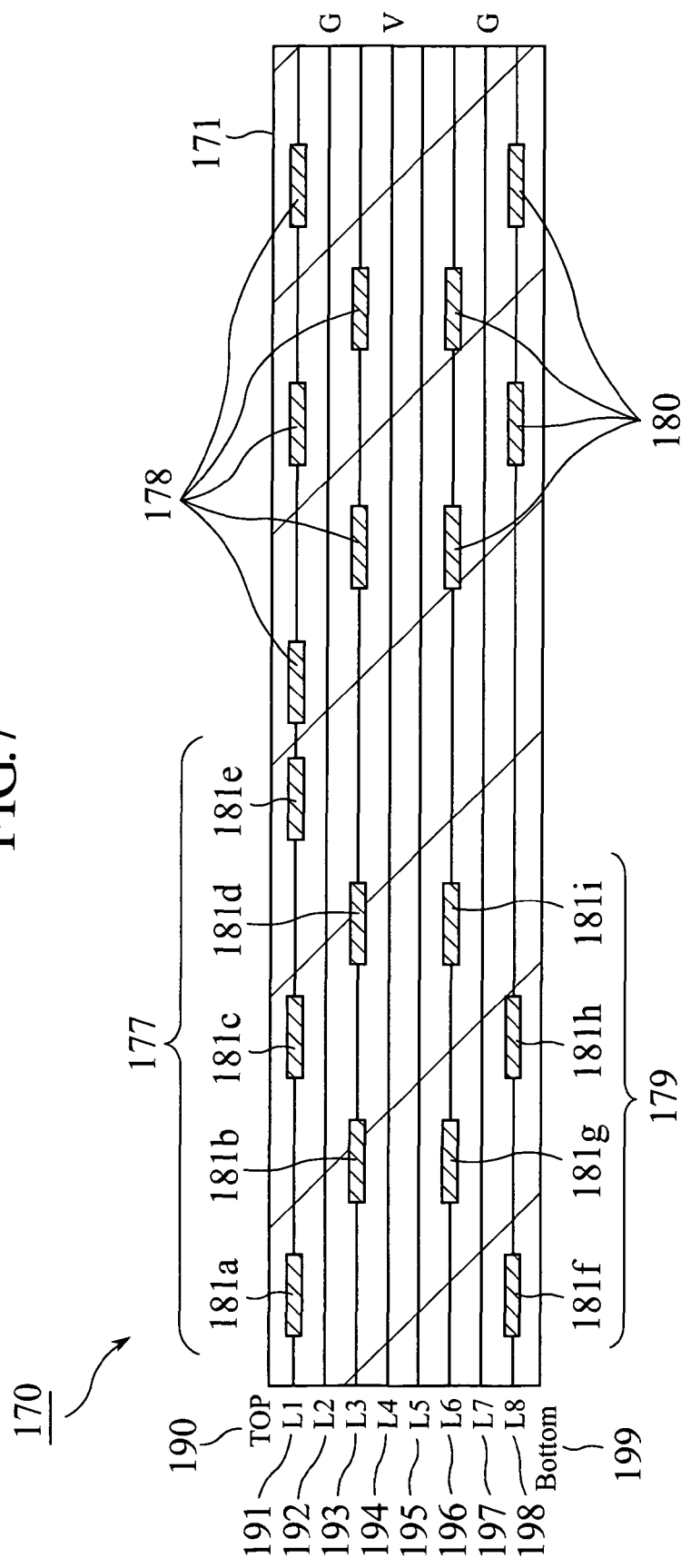
FIG. 7 is a cross sectional view of a memory module comprising a plurality of layers on which memory chips are arranged.

FIG. 7 is a cross sectional view of a memory module 170 of a fifth embodiment of the present invention.

Referring to FIG. 7, the memory module 170 comprises a module board 171. The module board 171 comprises a top portion 190 and a bottom portion 199. The top portion 190 comprises L1 to L4 layers 191 to 194. The bottom portion 199 comprises L5 to L8 layers 195 to 198. The L4 layer 194 is a power supply layer (V). The L2 and L7 layers 192 and 197 are ground layers (G). The L1 to L8 layers 191 to 198 are layered from top to the bottom in order. A distance between the L1 layer 191 and the L2 layer 192 differs from a distance between the L2 layer 192 and the L3 layer 193. A distance between the L6 layer 196 and the L7 layer 197 differs from a distance between the L7 layer 197 and the L8 layer 198.

Figure 9:
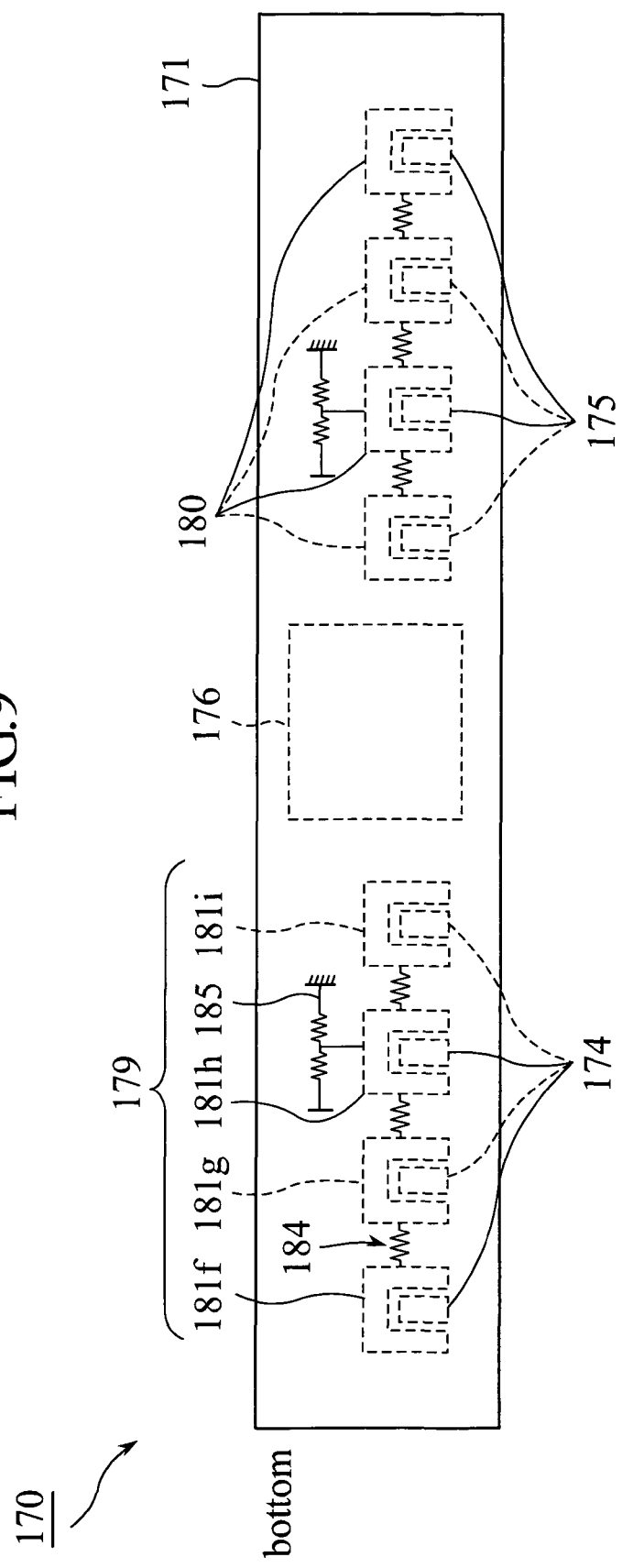
FIG. 9 is a plan view of the bottom portion of FIG. 7.

FIG. 8 is a plan view of the memory module 170 in the top portion 190. FIG. 9 is a plan view of the memory module 170 in the bottom portion 191. Referring to FIG. 8 and FIG. 9, the memory module 170 further comprises first to fourth groups of memory chips 172 to 175, a controller chip 176 and a first to fourth reference voltage supplying circuits 177 to 180.

Referring to FIG. 8, the first and second groups of memory chips 172 and 173 comprise five memory chips, respectively. Referring to FIG. 7, the first and second groups of memory chips 172 and 173 are aligned on the L1 layer 191 along the longer direction. The plurality of memory chips included in the first and second groups of memory chips 172 and 173 are aligned along the longer direction, respectively.

Referring to FIG. 9, the third and fourth groups of memory chips 174 and 175 comprise four memory chips, respectively. Referring to FIG. 7, the third and fourth groups of memory chips 174 and 175 are aligned on the L8 layer 198 along the longer direction. The plurality of memory chips included in the third and fourth groups of memory chips 174 and 175 are aligned along the longer direction, respectively.

Each memory chip of first to fourth groups of memory chips 172 to 175 comprises reference pins and ground pins.

Referring to FIG. 9, the controller chip 176 is arranged between the third group of memory chips 174 and the fourth group of memory chips 175 in a bottom portion 199 and controls data transfer, and so on.

Referring to FIG. 8, the first reference voltage supply circuit 177 comprises first to fifth reference electrodes 181a to 181e, a connection portion 182, a Thevenin termination portion 183 and five decoupling capacitors (not show). The first to fifth reference electrodes 181a to 181e has a same shape as the first to fourth reference electrode 20a to 20d of the first embodiment. The first to fifth reference electrodes 181a to 181e of this embodiment may have a plurality of shapes as the first to fourth reference electrode 120a to 120d of the fourth embodiment. Referring to FIG. 7, the first, third and fifth reference electrodes 181a, 181c and 181e are arranged on the L1 layer 191. The second and fourth reference electrodes 181b and 181d are arranged on the L3 layer 193.

The first to fifth reference electrodes 181a to 181e are connected to the reference pins of first group of memory chips 172, respectively. The decoupling capacitors are connected between the reference pins of first group of memory chips 172 and the L2 layer 192, respectively. The ground pins are connected to the L2 layer 192.

The connection portion 182 comprises four resistors and connects the first to fifth reference electrodes 181a to 181e in series in order. The connection portion 182 may comprise four inductors.

The Thevenin termination portion 183 is connected to the third reference electrode 181c. The Thevenin termination portion 183 makes a reference potential from the VSS and the Vdd. The reference potential is transmitted through the first to fifth reference electrodes 181a to 181e.

Because the distance between the L1 layer 191 and the L2 layer 192 differs from the distance between the L3 layer 193 and the L2 layer 192, a capacitance of the first, third and fifth reference electrodes 181a, 181c and 181e are differs from a capacitance of the second and fourth reference electrodes 181b and 181d.

The first and second reference voltage supply circuits 177 and 178 comprise a symmetrical construction. Connections relating to the second group of memory chips 173 and the second reference voltage supply circuit 178 are similar to the connections relating to the first group of memory chips 172 and the first reference voltage supply circuit 177.

The third reference voltage supply circuit 179 comprises eleventh to fourteenth reference electrodes 181f to 181i, a connection portion 184 and a Thevenin termination portion 185. The third reference voltage supply circuit 179 comprises four decoupling capacitors (not show).

The eleventh to fourteenth reference electrodes 181f to 181i have a same shape as the first to fourth reference electrode 20a to 20d of the first embodiment. The eleventh to fourteenth reference electrodes 181f to 181i may have a plurality of shapes as the first to fourth reference electrodes 120a to 120d of the of the fourth embodiment. The eleventh and thirteenth reference electrodes 181f and 181h are arranged on the L8 layer 198. The twelfth and fourteenth reference electrodes 181g and 181i are arranged on the L6 layer 196.

The eleventh to fourteenth reference electrodes 181g to 181i are connected to the reference pins of third group of memory chips 179, respectively. The decoupling capacitors are connected between the reference pins of third group of memory chips 179 and the L7 layer 197, respectively. The ground pins are connected to the L7 layer 192.

The connection portion 184 comprises three resistors and connects the eleventh to fourteenth reference electrodes 181f to 181i in series in order. The connection portion 184 may comprise three inductors.

The Thevenin termination portion 185 is connected to the thirteenth reference electrode 181h. The Thevenin termination portion 185 makes a reference potential from the VSS and the Vdd. The reference potential is transmitted to the eleventh to fourteenth reference electrodes 181f to 181i.

Because the distance between the L6 layer 196 and the L7 layer 197 differs from the distance between the L7 layer 197 and the L8 layer 198, a capacitance of the eleventh and thirteenth reference electrodes 181f and 181h differs from a capacitance of the twelfth and fourteenth reference electrodes 181g and 181i.

The third and fourth reference voltage supply circuit 179 and 180 comprise a symmetrical construction. Connections relating to the fourth group of memory chips 175 and the fourth reference voltage supply circuit 180 are similar to the connections relating to the third group of memory chips 174 and the third reference voltage supply circuit 179.

Figure 10:
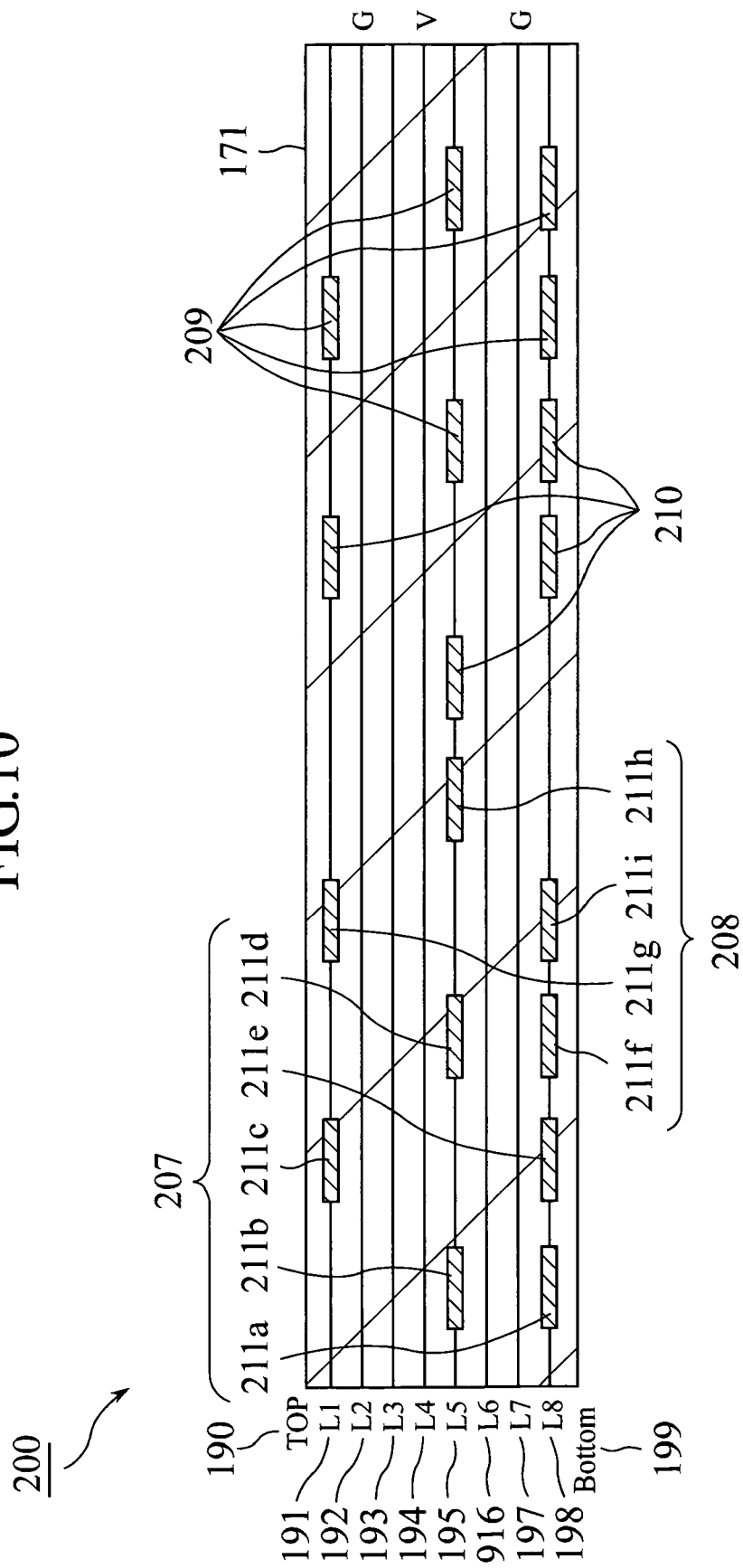
FIG. 10 is a cross sectional view of another memory module comprising a plurality of layers on which memory chips are arranged.
Figure 11:
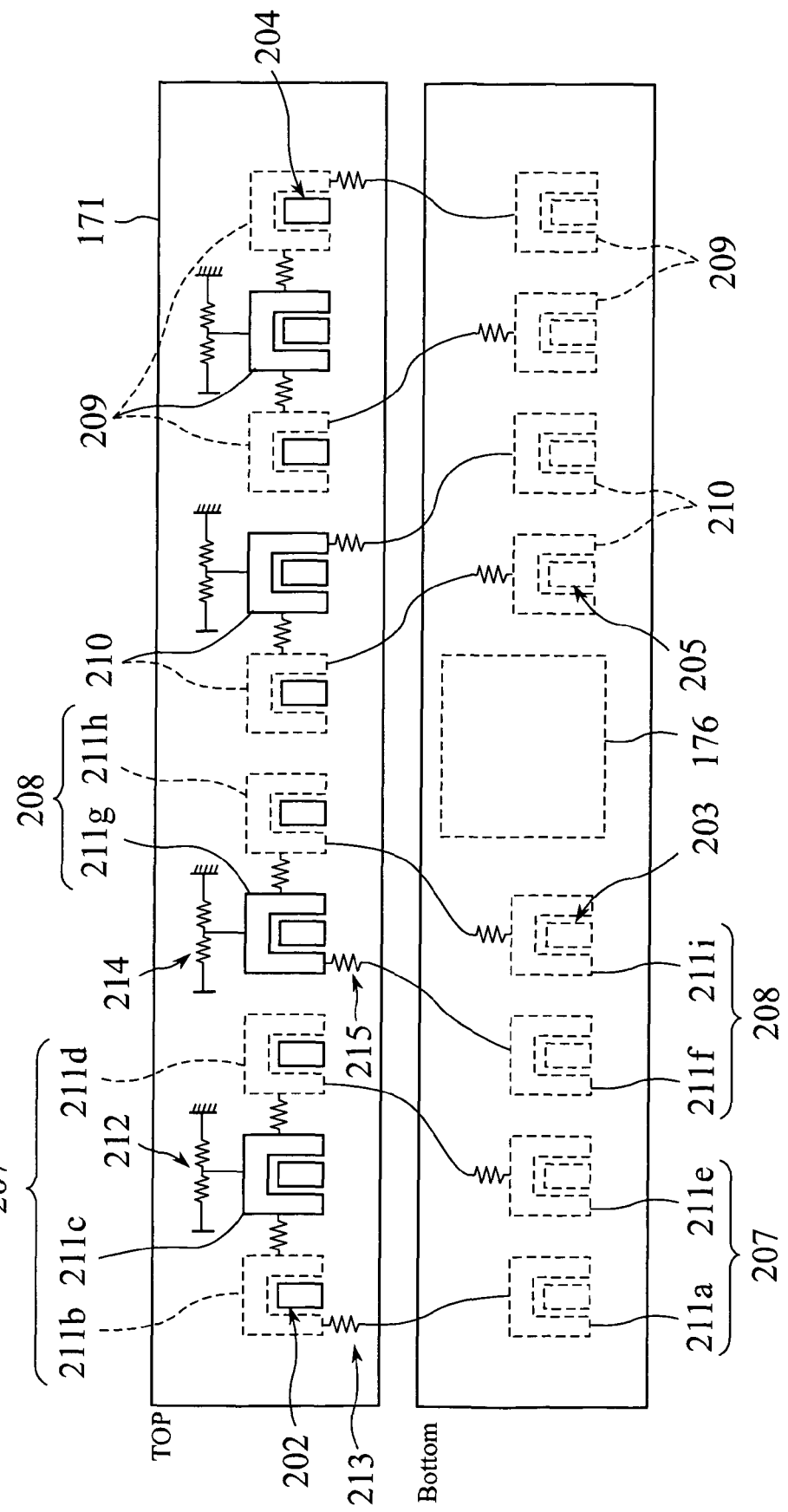
FIG. 11 is a plan view of the memory module of FIG. 10.

FIG. 10 is a cross sectional view of a memory module 200 of a sixth embodiment of the present invention. FIG. 11 is a plan view of the memory module 200 in the top portion 190 and the bottom portion 199 of FIG. 10. Referring to FIG. 11, the memory module 200 comprises first to fourth groups of memory chips 202 to 205 instead of first to fourth groups of memory chips 172 to 175 in the fifth embodiment. The memory module 200 further comprises first to fourth reference voltage supplying portions 207 to 210 instead of first to fourth reference voltage supplying portions 177 to 180 in the fifth embodiment.

Referring to FIG. 11, ten memory chips are aligned on the L1 layer 191 along the longer direction and eight memory chips are aligned on the L8 layer 198 along the longer direction. The first group of memory chips 202 comprises the leftmost three memory chips in the L1 layer 191 and the leftmost two memory chips in the L8 layer 198. The second group of memory chips 203 comprises rest two memory chips of left five memory chips in the L1 layer 191 and rest two memory chips of left four memory chips in the L8 layer 198. The third group of memory chips 204 comprises the rightmost three memory chips in the L1 layer 191 and the rightmost two memory chips in the L8 layer 198. The fourth group of memory chips 205 comprises rest two memory chips of right five memory chips in the L1 layer 191 and rest two memory chips of right four memory chips in the L8 layer 198.

The first reference voltage supply circuit 207 comprises first to fifth reference electrodes 211a to 211e, a connection portion 213 and a Thevenin termination portion 212 and five decoupling capacitors (not shown). The first and fifth reference electrodes 211a and 211e are arranged on the L8 layer 198. The second and fourth reference electrodes 211b and 211d are arranged on the L5 layer 195. The third reference electrodes 211c are arranged on the L1 layer 191. The connection portion 213 connects the first to fifth reference electrodes 211a to 211e in series in order. The Thevenin termination portion 212 supplies a reference potential to the third reference electrodes 211c.

The second reference voltage supply circuit 208 comprises first to fourth reference electrodes 211f to 211i, a connection portion 215 and a Thevenin termination portion 214 and four decoupling capacitors (not shown). The sixth and ninth reference electrodes 211f and 211i are arranged on the L8 layer 198. The seventh reference electrode 211g are arranged on the L1 layer 191. The eighth reference electrode 211h are arranged on the L5 layer 195. The connection portion 215 connects the sixth to ninth reference electrodes 211f to 211i in series in order. The Thevenin termination portion 214 supplies a reference potential to the seventh reference electrodes 211g.

Because the distance from the L1 layer 191 to the L2 layer 192, from the L5 layer 195 to the L7 layer 197 and from the L8 layer 198 to the L7 layer 197 are different each other, a capacitance of the first, fifth, sixth and ninth reference electrodes 211a, 211e, 211f and 211i, a capacitance of the second, fourth and eighth reference electrodes 211b, 211d and 211h and a capacitance of the third and seventh reference electrodes 211c and 211g are different.

The first and third reference voltage supply circuits 207 and 209 comprise a symmetrical construction. Connections relating to the third group of memory chips 204 and the third reference voltage supply circuit 209 are similar to the connections relating to the first group of memory chips 202 and the first reference voltage supply circuit 207. The second and fourth reference voltage supply circuit 208 and 210 comprise a symmetrical construction. Connections relating to the fourth group of memory chips 205 and the fourth reference voltage supply circuit 210 are similar to the connections relating to the second group of memory chips 203 and the second reference voltage supply circuit 208.

Figure 12:
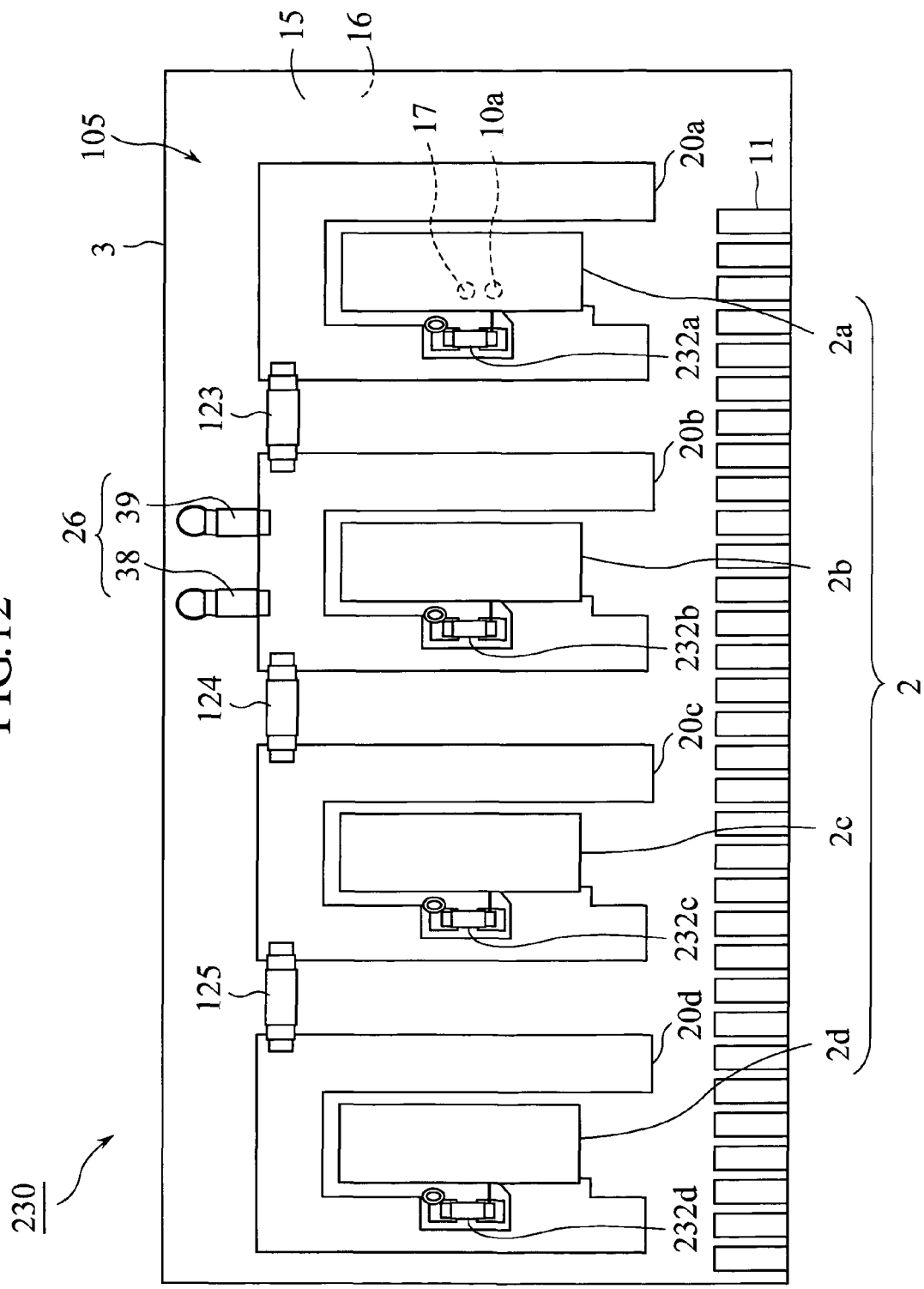
FIG. 12 is a plan view of the memory module comprising a plurality of decoupling capacitors having different capacitances.

FIG. 12 shows a memory module 230 of a seventh embodiment of the present invention. The memory module 230 comprises a reference voltage supply circuit 105 and first to third connection portions 123 to 125 in the memory module 1 of the first embodiment instead of the reference voltage supply circuit 4 and the first to third connection portions 23 to 25, respectively. The reference voltage supply circuit 105 comprises a first to fourth decoupling capacitors 232a to 232d instead of the decoupling capacitors 21a to 21d in the reference voltage supply circuit 4 of the first embodiment. The first and third decoupling capacitors 232a and 232c have a same capacitance $C_{dc1}$. The second and fourth decoupling capacitors 232b and 232d have a same capacitance $C_{dc2}$. The capacitance $C_{dc1}$ is different from $C_{dc2}$. Preferably, the difference of the capacitance $C_{dc1}$ and $C_{dc2}$ is 10% or more of $C_{dc1}$ or $C_{dc2}$. The first to third connection portions 123 to 125 are resistors and have a same resistance of 100Ω.

Figure 13:
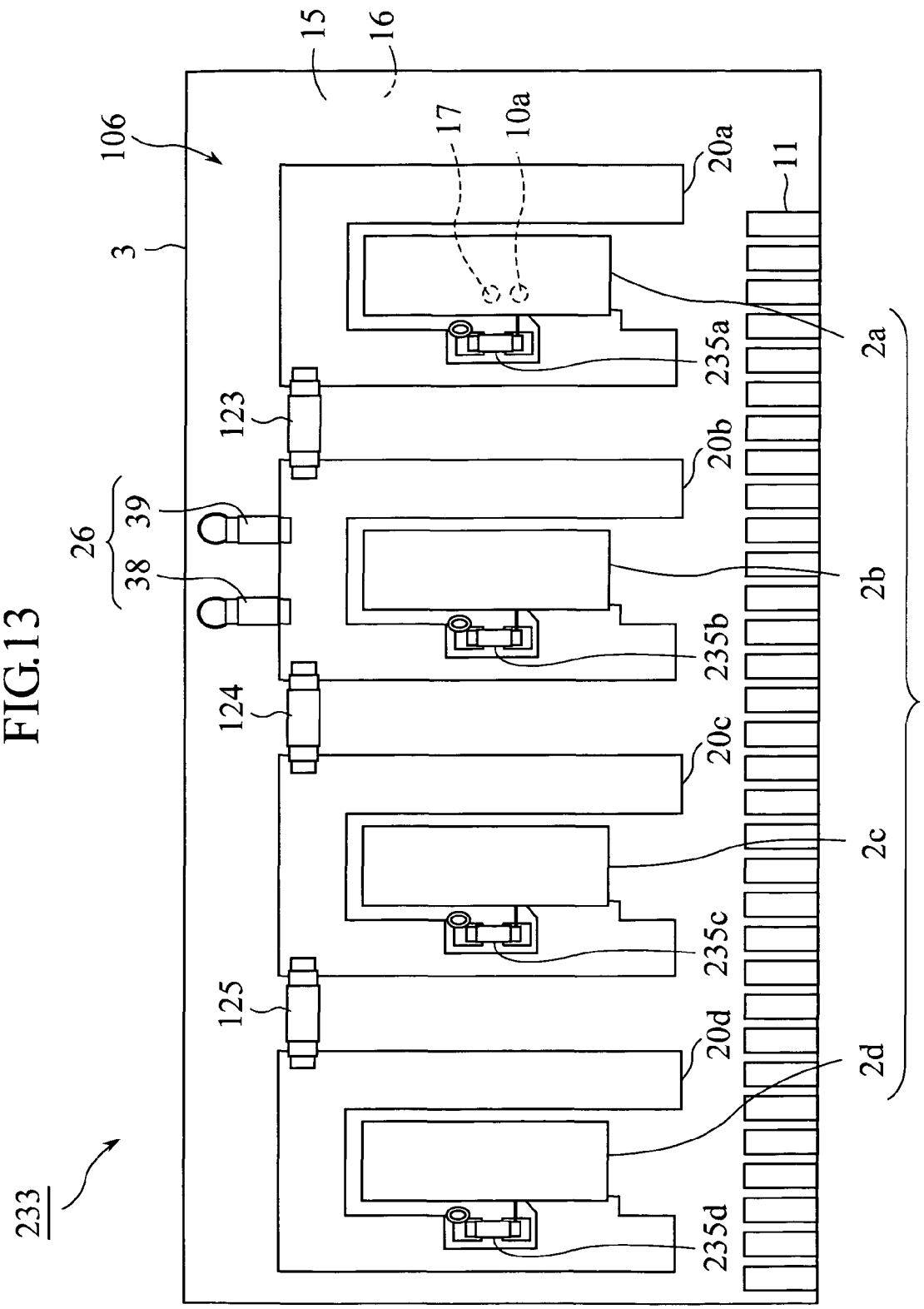
FIG. 13 is a plan view of the memory module comprising a plurality of decoupling capacitors having different equivalent series inductance.

FIG. 13 shows a memory module 233 of an eighth embodiment of the present invention. The memory module 233 comprises a reference voltage supply circuit 106 and first to third connection portions 123 to 125 in the memory module 1 of the first embodiment instead of the reference voltage supply circuit 4 and the first to third connection portions 23 to 25, respectively. The reference voltage supply circuit 106 comprises a first to fourth decoupling capacitors 235a to 235d in the reference voltage supply circuit 4 of the first embodiment instead of the decoupling capacitors 21a to 21d.

The first and third decupling capacitors 235a and 235c have a same equivalent series inductance $L_{dc1}$. The second and fourth decoupling capacitors 235b and 235d have a same equivalent series inductance $L_{dc2}$. The inductance $L_{dc1}$ is different from inductance $L_{dc2}$. Preferably, the difference of the inductance $L_{dc1}$ and $L_{dc2}$ is 10% or more of $L_{dc1}$ or $L_{dc2}$. The first to third connection portions 123 to 125 are resistors and have a same resistance of 100Ω.

The difference of the inductances $L_{dc1}$ and $L_{dc2}$ may be adjusted by selecting sizes or model numbers or making patterns of the electrode for mounting the first to fourth decoupling capacitors 235a to 235d.

Figure 14:
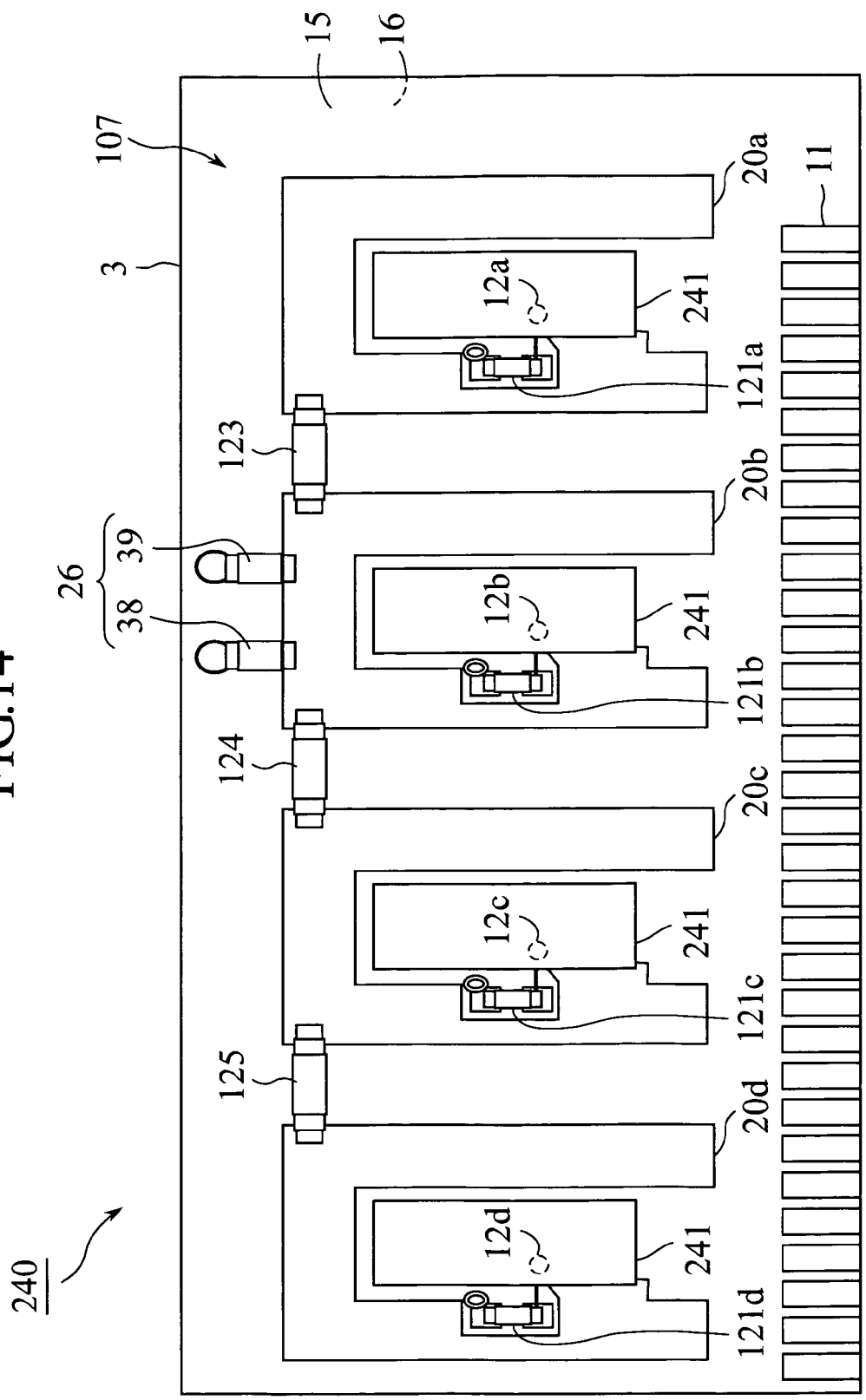
FIG. 14 is a plan view of a memory module comprising a memory package.

FIG. 14 shows a plan view of a memory module 240 of a ninth embodiment of the present invention. The memory module 240 comprises four memory packages 241 in the memory module 1 instead of the first to fourth memory chips 2a to 2d. The memory module 240 further comprises a reference voltage supply circuit 107 and first to third connection portions 123 to 125 instead of the reference voltage supply circuit 4 and the first to third connection portions 23 to 25 of the first embodiment, respectively. The reference voltage supply circuit 107 comprises a first to fourth decoupling capacitors 121a to 121d of the fourth embodiment in the reference voltage supply circuit 4 of the first embodiment instead of the decoupling capacitors 21a to 21d. The first to third connection portions 123 to 125 are resistances and have a same resistance of 100Ω.

Figure 15:
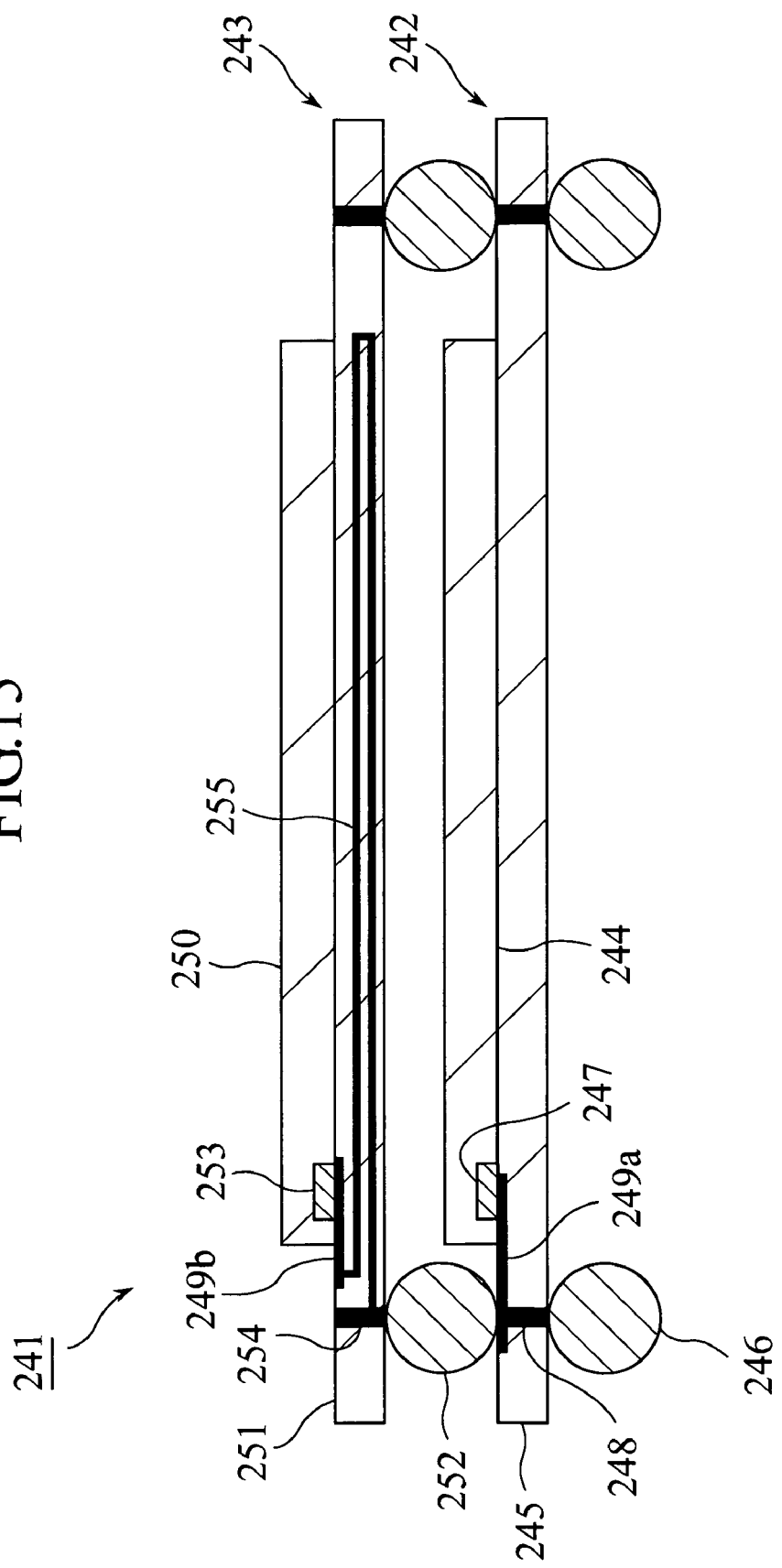
FIG. 15 is a cross sectional view of the memory package of FIG. 14.

FIG. 15 shows a cross sectional view of the memory package 241. Referring to FIG. 15, the memory package 241 comprises lower and upper packages 242 and 243.

The lower package 242 comprises a lower memory chip 244, a lower package substrate 245 and a lower ball electrode 246. The lower package substrate 245 comprises a lower via hole 248, a lower line 249a and lower and upper surfaces. The lower via hole 248 is arranged to pierce from the lower surface to the upper surface of the lower package substrate 245. The lower line 249a is elongated form the lower via hole 248 in the upper surface of the lower package substrate 245. The lower ball electrode 246 is in contact with the lower via hole 248 at the lower surface of the lower package substrate 245. The lower ball electrodes 246 are in contact with the first to fourth reference pad 12a to 12d, respectively. The lower memory chip 244 is mounted on the upper surface of the lower package substrate 245 and comprises a lower pad 247 which is in contact with the lower line 249a.

The upper package 243 comprises an upper memory chip 250, an upper package substrate 251 and an upper ball electrode 252. The upper package substrate 251 comprises an upper via hole 254, first and second upper lines 255 and 249b and lower and upper surfaces. The upper via hole 254 is arranged to pierce from the lower surface to the upper surface of the upper package substrate 251. The first upper line 255 is elongated from an inside of the upper via hole 254 to the upper surface of the upper package substrate 251. The second upper line 249b is arranged in the upper surface of the upper package substrate 251 and is in contact with the first upper line 255. The upper ball electrode 252 is in contact with the upper via hole 254 at the lower surface of the upper package substrate 251. The upper ball electrode 252 is in contact with the lower via hole 248 at the upper surface of the lower package substrate 245. The upper memory chip 250 is mounted on the upper surface of the upper package substrate 251 and comprises an upper pad 253 which is in contact with the upper line 249b.

A sum of length of the first and second upper lines 255 and 249b is longer than a length of the lower line 249a. A whole ESL of the first and second upper lines 255 and 249b is different from an ESL of the lower line 249b by 10% of an ESL of the first decoupling capacitor 121a. An inductance from the lower ball electrode 246 to the lower pad 247 is different from an inductance from the upper ball electrode 252 to the upper pad 253 by 10% or more. An ESL from the first decoupling capacitor 121a of FIG. 14 to the lower pad 247 of FIG. 15 is different from an ESL from the first decoupling capacitor 121a of FIG. 14 to the upper pad 253 of FIG. 15. A driving-point impedance of the lower memory chip 244 between Vref and VSS observed at the lower pad 247 is different from driving-point impedance of the upper memory chip 250 between Vref and VSS observed at the upper pad 253.

The lower line 249a and the second upper line 249b may be made of solidly filled plane patterns which is connected to ground layers being arranged in the first memory package 241 and an inductance of the first upper line 255 may be 10% of an ESL of the first decoupling capacitor 121a.

The memory package 241 comprises three or more stacked memory chips. If the memory package 241 comprises a plurality of stacked memory chips, preferably, the memory packages 241 may comprise alternating layers of the lower package 242 and the upper package 243.

Figure 16:
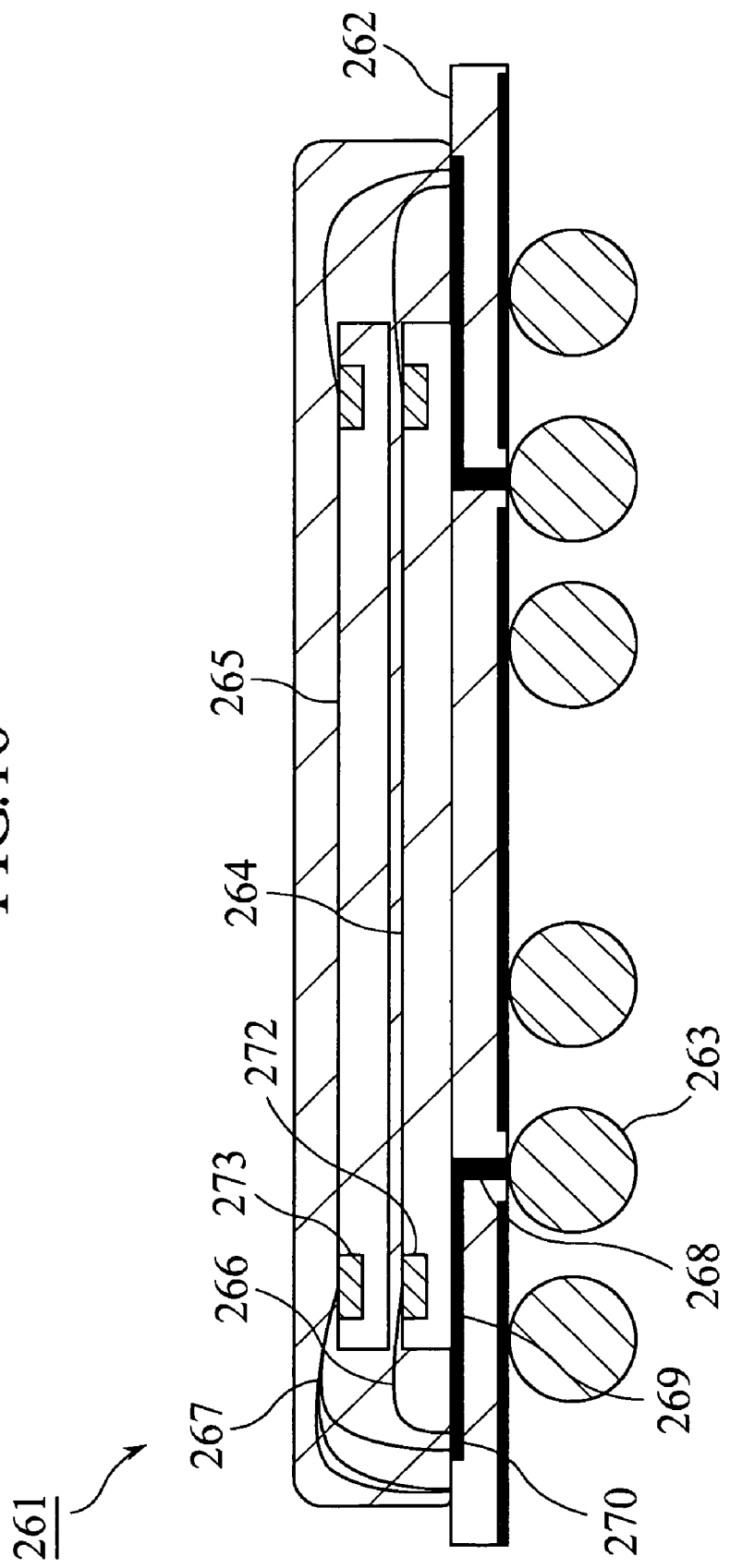
FIG. 16 is a cross sectional view of another memory package.

A memory module 240 of a ninth embodiment of the present invention comprises four memory packages 261 instead of the four memory packages 241 of the eighth embodiment. FIG. 16 shows a cross sectional view of a memory package 261.

The memory package 261 comprises a package substrate 262, a ball electrode 263, a lower memory chip 264, an upper memory chip 265, a lower bonding wire 266 and an upper bonding wire 267.

Figure 17:
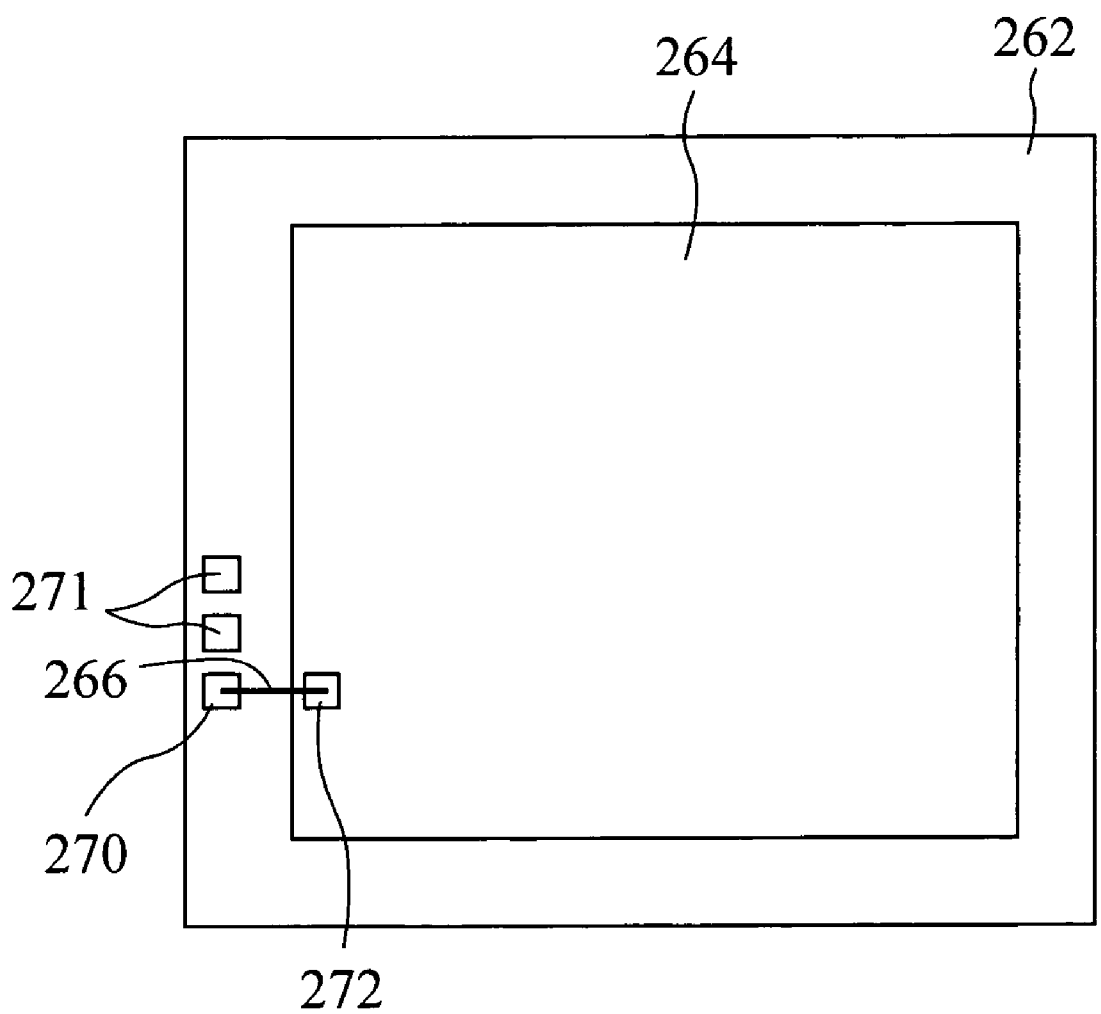
FIG. 17 is a plan view of the lower memory chip of FIG. 16.
Figure 18:
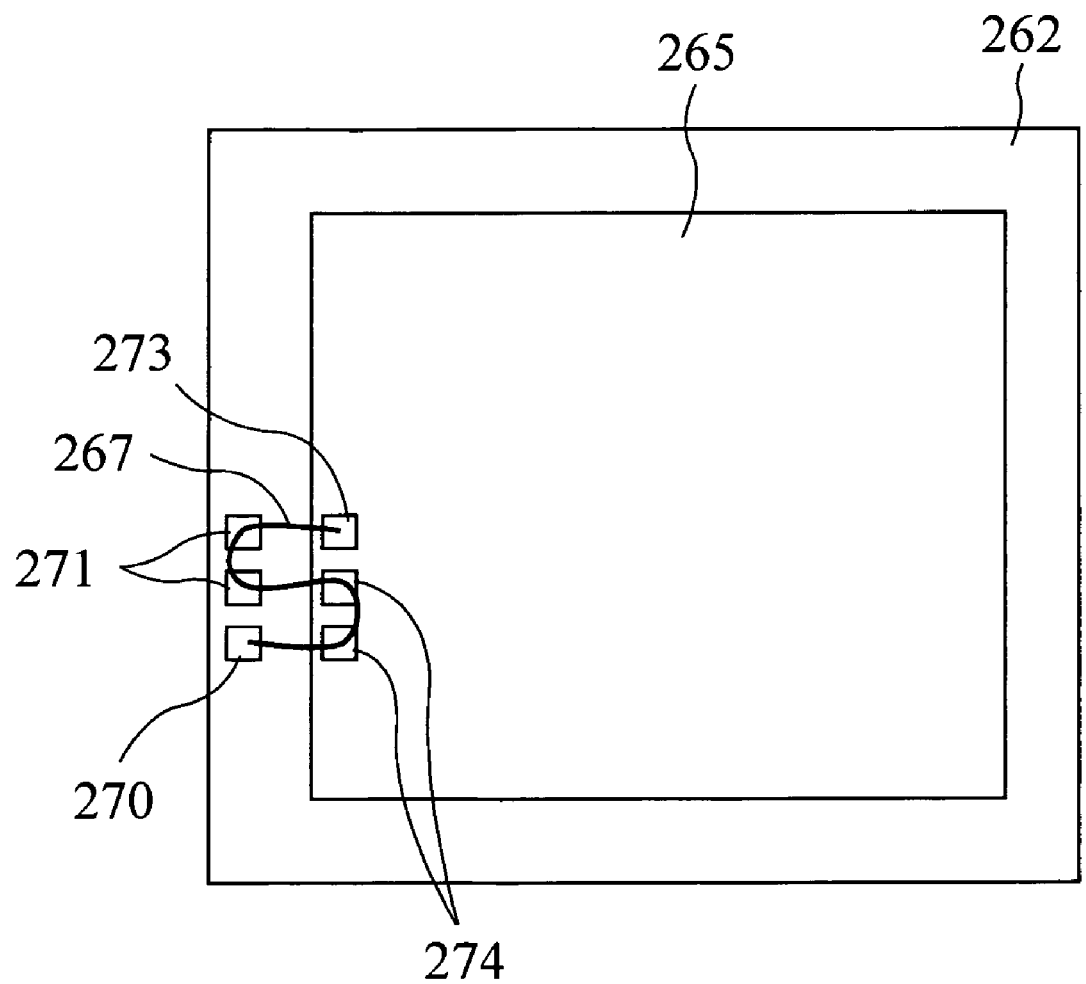
FIG. 18 is a plan view of the upper memory chip of FIG. 17.

FIG. 17 shows a plan view of the lower memory chip 264 and the package substrate 262. FIG. 18 shows a plan view of the upper memory chip 265 and the package substrate 262. Referring to FIG. 16, the package substrate 262 comprises a via hole 268, a line 269 and lower and upper surfaces. Referring to FIG. 17, the package substrate 262 further comprises a substrate reference pad 270 and two substrate NC pads 271. Referring to FIG. 16, the via hole 268 is arranged to pierce from the lower surface to the upper surface of the package substrate 262. The substrate reference pad 270 and the two NC pads 271 are arranged on the upper surface of the package substrate 262. The line 269 is elongated on the upper surface and connects the via hole 268 to the substrate reference pad 270.

The ball electrode 263 is in contact with the via hole 268 on the lower surface of the package substrate 262.

The lower memory chip 264 is arranged on the upper surface of the package substrate 262 and comprises a lower reference pad 272. Referring to FIG. 16 and FIG. 18, the upper memory chip 265 is arranged on the lower memory chip 264 and comprises an upper reference pad 273 and two upper NC pads 274.

Referring to FIG. 17, the lower bonding wire 266 connects the substrate reference pad 270 to the lower reference pad 272. The upper bonding wire 267 connects the substrate reference pad 270 to the upper reference pad 273 by way of the upper NC pads 274 and the substrate NC pads 271. The upper bonding wire 267 is longer than the lower bonding wire 266. The upper bonding line 267 is different from the lower bonding line 266 by 10% of an ESL of the first decoupling capacitor 121a. An ESL of an first pathway from the first decoupling capacitor 121a of FIG. 14 to the lower reference pad 272 of FIG. 17 is different from an ESL of an second pathway from the first decoupling capacitor 121a of FIG. 14 to the upper reference pad 273 of FIG. 17 by 10% of the ESL of the first or second pathway. A driving-point impedance of the lower memory chip 264 between Vref and VSS observed at the lower reference pad 272 is different from driving-point impedance of the upper memory chip 265 between Vref and VSS observed at the upper reference pad 273.

The memory package 261 may comprise three or more stacked memory chips. If the memory package 261 comprises a plurality of stacked memory chips, preferably, the memory packages 261 may comprise alternating layers of the lower memory chip 264 and the upper memory chip 265 wherein each bonding wire being in contact with the upper memory chip 265 may be longer than each bonding wire which is in contact with the lower memory chip 264.

Figure 19:
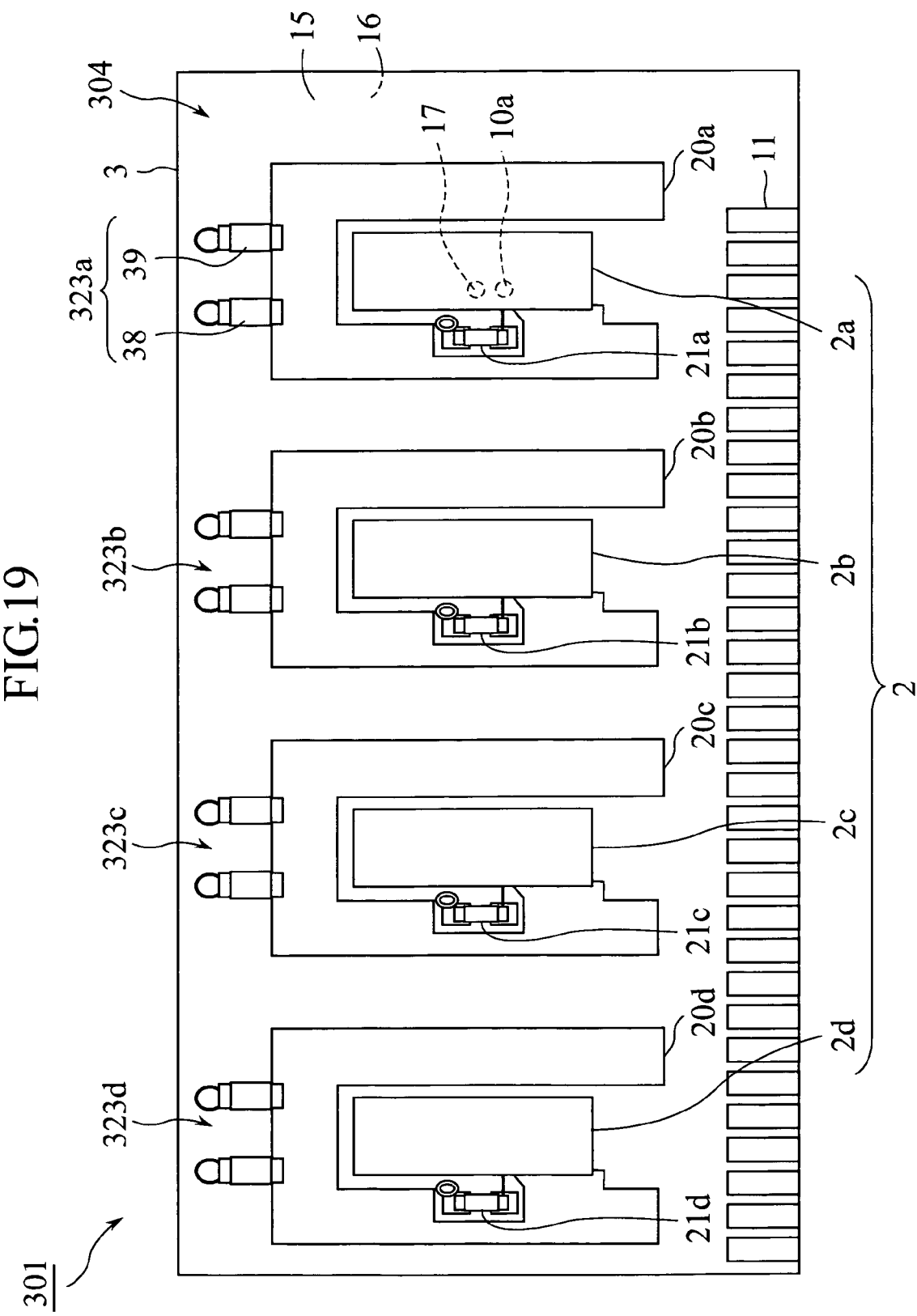
FIG. 19 is a plan view of a memory module comprising a plurality of Thevenin termination portions.

Referring to FIG. 19, a memory module 301 of an eleventh embodiment of this invention comprises a reference voltage supply circuit 304 instead of the reference voltage supply circuit 4 in the memory module 1 of the first embodiment.

The reference voltage supply circuit 304 of this embodiment differs from the reference voltage supply circuit 4 of the first embodiment in that the reference voltage supply circuit 304 of this embodiment comprises a first to fourth Thevenin termination portion 323a to 323d instead of the Thevenin termination portion 26 of the first embodiment and does not comprises a first to third connection portion 23 to 25 of the first embodiment. Each first to fourth Thevein termination portion 323a to 323d comprises the same components of the Thevenin termination portion 26 of the first embodiment. The first to fourth Thevenin termination portions 323a to 323d make the supply reference potential and supply the reference potential to the first to fourth reference electrodes 20a to 20d, respectively.

Figure 20:
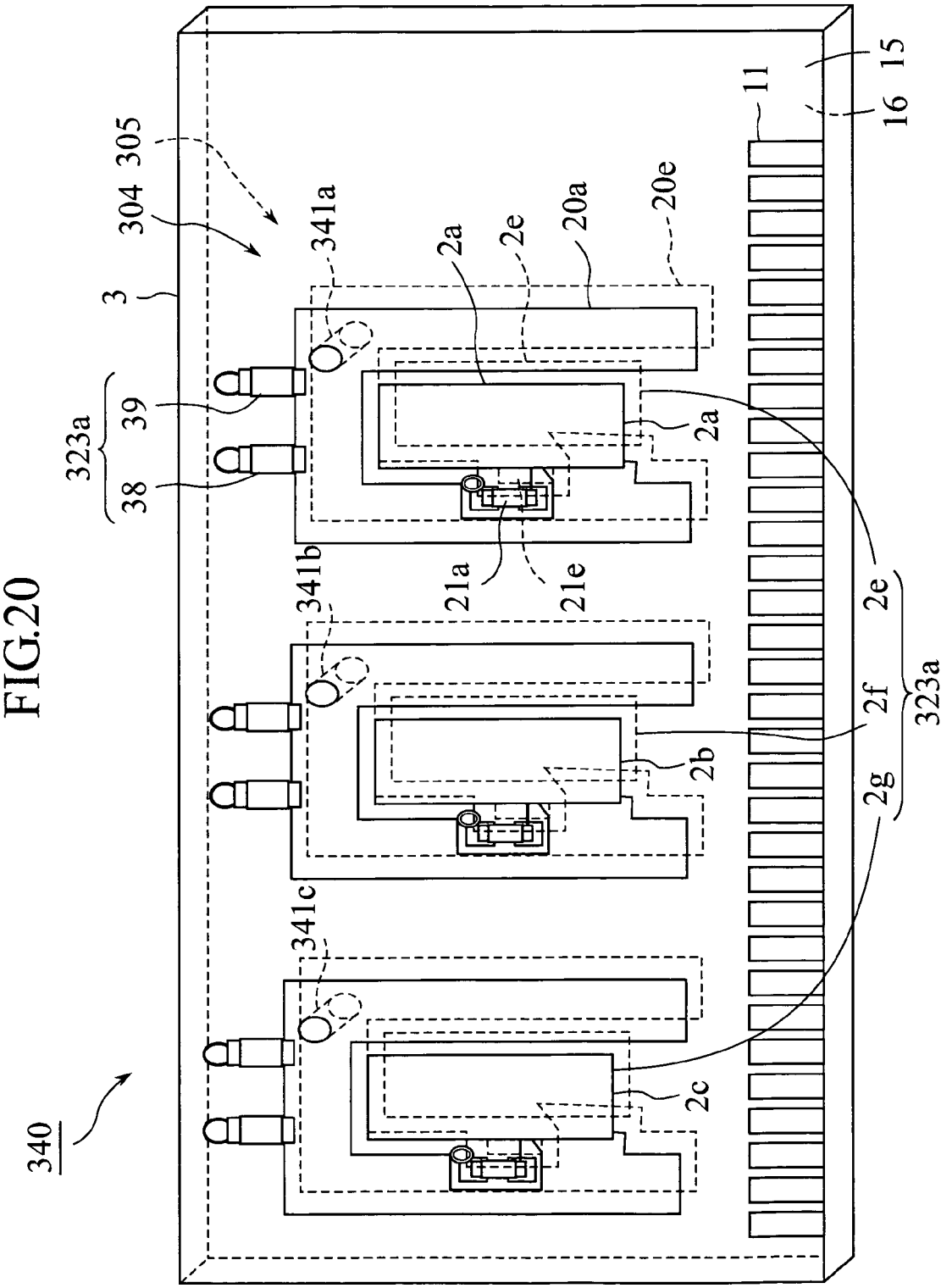
FIG. 20 is a plan view of a memory module of a twelfth embodiment of the present invention.

FIG. 20 shows a plan view of a memory module 340 of a twelfth embodiment of this invention. Referring to FIG. 20, the memory module 340 comprises the whole elements of the memory module 301 in the eleventh embodiment. The memory module 340 of this embodiment further comprises a secondary group of memory chips 305, a secondary reference voltage supply circuit 306 and first to third contact holes 341a to 341c.

The secondary group of memory chips 305 comprises a fifth to seventh memory chips 2e to 2g being arranged on the backside surface 16. The first to third memory chips 2a to 2c and the fifth to seventh memory chips 2e to 2g are symmetrically placed about the module board 3, respectively.

The secondary reference voltage supply circuit 306 is arranged on the backside surface 16. The reference voltage supply circuit 304 and the secondary reference voltage supply circuit 306 are comprises a symmetrical structure about the module board 3 and are symmetrically placed about the module board 3. The reference voltage supply circuit 306 comprises whole elements of the reference voltage supply circuit 304 except the first to fourth Thevenin termination portion 323a to 323c. The secondary reference voltage supply circuit 306 comprises a fifth to seventh reference electrode 20e to 20g which supplies the reference potential to the fifth to seventh memory chips 2e to 2g, respectively.

The contact holes 341a to 341c is arranged to pierce the module board 3 from the front side surface 15 to the back side surface 16. The contact holes 341a to 341c electrically connects the first to third reference electrode 20a to 20c with the fifth to seventh reference electrode 20e to 20g, respectively.

In the memory module 340, timings of actions of the group of memory chips 2a to 2c may differ from the secondary group of memory chips 2e to 2g.

Figure 21:
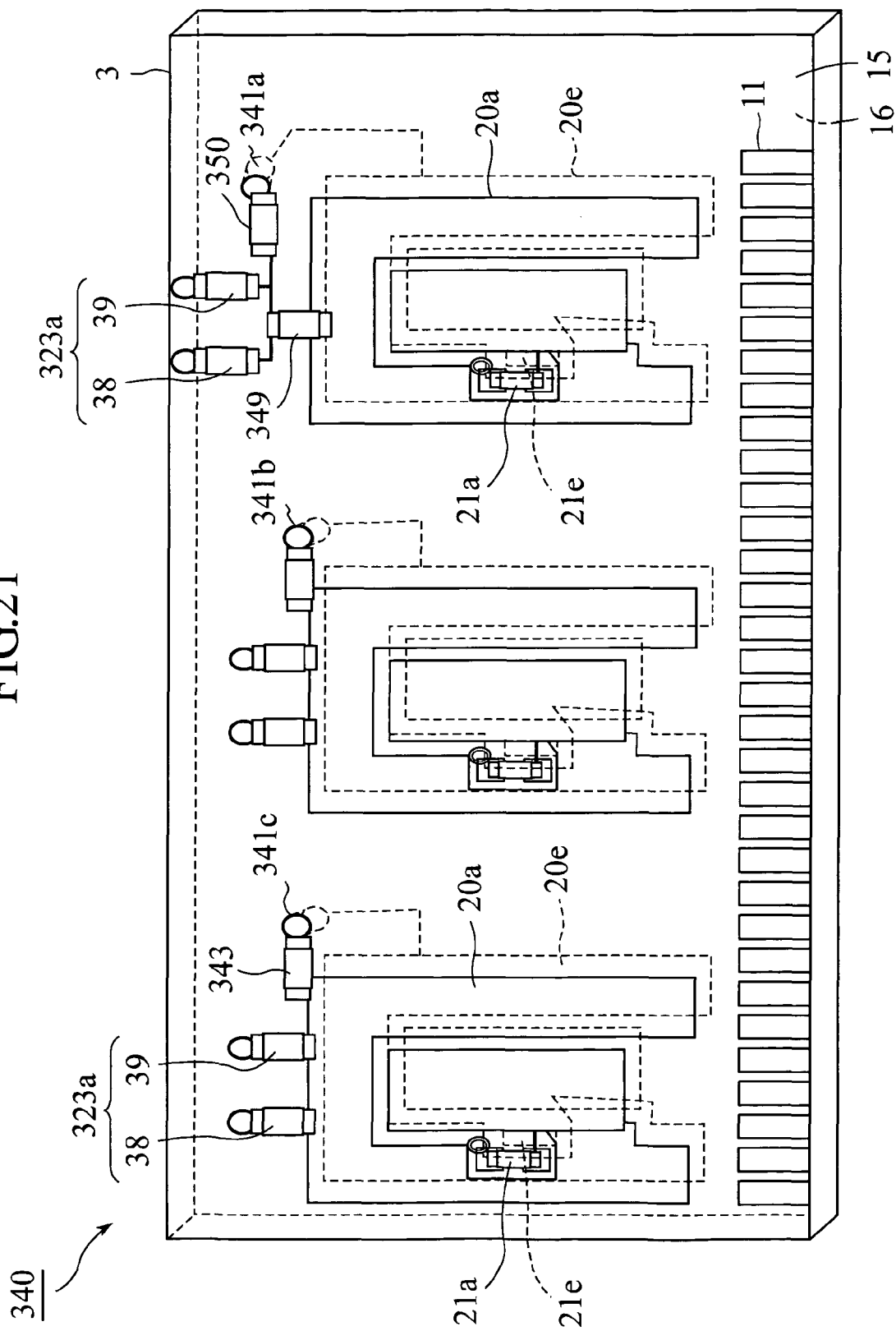
FIG. 21 is a plan view of another memory module of the twelfth embodiment of the present invention.
Figure 22:
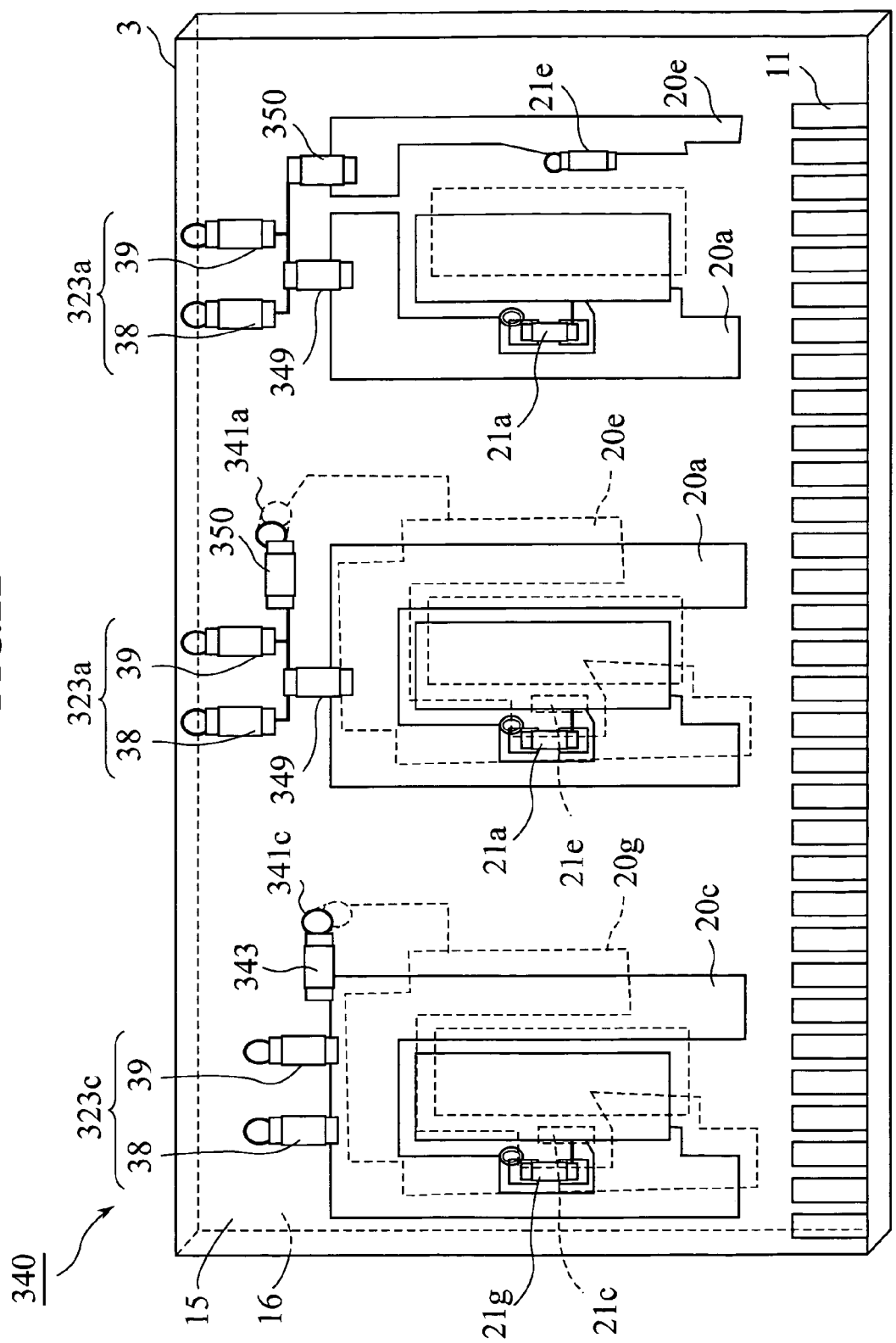
FIG. 22 is a plan view of another memory module of the twelfth embodiment of the present invention.

Referring to FIG. 21, the memory module 340 may further comprise a first resistance 343 which is arranged between the third reference electrode 20c and the third contact hole 341c in series. Referring to left hand side of FIG. 22, the third reference electrode 20c and the seventh reference electrode 20g may have different amounts of areas.

Referring to FIG. 21, the memory module 340 may comprise a second and third resistance 349 and 350 and a contact hole 341e. The second resistance connects the first termination resistance 38 with the first reference electrode 20a and connects the second termination resistance 39 with the first reference electrode 20a. The third resistance 350 connects the first termination resistance 38 with the contact hole 341e and connects the second termination resistance 39 with the contact hole 341e. The contact hole 341e is arranged between the second resistance and the fifth reference electrode 20e. Referring to middle of FIG. 22, the first reference electrode 20a and the fifth reference electrode 20e may have different amounts of areas. Referring to right hand side of FIG. 22, both the first reference electrode 20a and the fifth reference electrode 20e may be arranged on the front side surface 15 of the module board 3.

This application is based on Japanese Patent Application ser. no. 2005-248023 filed in Japan Patent Office on Aug. 29, 2005, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A semiconductor module comprising:
   a first semiconductor memory device comprising a first electrode;
   a second semiconductor memory device comprising a second electrode; and
   a reference voltage supplying circuit for supplying a reference potential to the first electrode and the second electrode and for suppressing a noise to be transferred between the first electrode and the second electrode, wherein:
   the reference voltage supplying circuit comprises a first reference electrode and a second reference electrode;
   the first reference electrode is a plane electrode connected to the first electrode; and
   the second reference electrode is a plane electrode connected to the second electrode.

2. The semiconductor module according to claim 1, wherein:
   the reference voltage supplying circuit comprises a first decoupling capacitor and a second decoupling capacitor;
   the first decoupling capacitor is connected to the first electrode and the first reference electrode; and
   the second decoupling capacitor is connected to the second electrode and the second reference electrode.

3. The semiconductor module according to claim 2, wherein:
   the reference voltage supplying circuit comprises a connection portion connected between the first reference electrode and the second reference electrode; and
   the connection portion has an equivalent series inductance which is ten times or more of an equivalent series inductance of the first decoupling capacitor.

4. The semiconductor module according to claim 3, wherein the connection portion comprises a resistor and an inductor connected to the resistor in series.

5. The semiconductor module according to claim 4, wherein the inductor comprises a trace, which has a width and a length equal to or less than one-hundredth of the width.

6. The semiconductor module according to claim 2, wherein:
   the reference voltage supplying circuit comprises a first circuit and a second circuit;
   the first circuit comprises the first reference electrode and the first decoupling capacitor;
   the second circuit comprises the second reference electrode and the second decoupling capacitor;
   the first circuit comprises a first anti-resonant frequency;

the second circuit comprises a second anti-resonant frequency different from the first anti-resonant frequency.

7. The semiconductor module according to claim 6, wherein the second anti-resonant frequency is different from the first anti-resonant frequency by 5% or more of a basic frequency of the first anti-resonant frequency.

8. The semiconductor module according to claim 2, wherein the first decoupling capacitor has a first capacitance, while the second decoupling capacitor has a second capacitance different from the first capacitance.

9. The semiconductor module according to claim 8, wherein the second capacitance is different from the first capacitance by 10% or more of the first capacitance.

10. The semiconductor module according to claim 2, wherein the first decoupling capacitor has a first equivalent series inductance, while the second decoupling capacitor has a second equivalent series inductance different from the first equivalent series inductance by 10% or more of the first equivalent series inductance.

11. The semiconductor module according to claim 2, further comprising a third semiconductor memory device including a third electrode, a first pathway and a second pathway, wherein:
the third semiconductor memory device is mounted on the first semiconductor memory device;
the third electrode is connected to the first electrode and the first decoupling capacitor;
the first pathway exists between the first decoupling capacitor and the first semiconductor memory device and has a first equivalent series inductance;
the second pathway exists between the first decoupling capacitor and the third semiconductor memory device and has a second equivalent series inductance;
the second equivalent series inductance is different from the first equivalent series inductance by 10% or more of the first equivalent series inductance.

12. The semiconductor module according to claim 1, wherein the first reference electrode has a first area, and the second reference electrode has a second area different from the first area.

13. The semiconductor module according to claim 12, wherein the second area is different from the first area by 10% or more of the first area.

14. The semiconductor module according to claim 1, further comprising a ground layer, wherein a distance between the first reference electrode and the ground layer is different from another distance between the second reference electrode and the ground layer.

15. The semiconductor module according to claim 1, wherein the reference voltage supplying circuit comprises a first Thevenin termination portion supplying a reference potential to the first electrode and a second Thevenin termination portion supplying the reference potential to the second electrode.

16. The semiconductor module according to claim 1, wherein:
the reference voltage supplying circuit comprises a Thevenin termination portion;
a first resistor and a second resistor;
the Thevenin termination portion supplies a reference potential to the first electrode and the second electrode;
the first resistor is connected between the Thevenin termination portion and the first reference electrode; and
the second resistor is connected between the Thevenin termination portion and the second reference electrode.

17. A semiconductor module comprising:
a first semiconductor memory device comprising a first electrode;
a second semiconductor memory device comprising a second electrode;
a reference voltage supplying circuit for supplying a reference potential to the first electrode and the second electrode and for suppressing a noise to be transferred between the first electrode and the second electrode; and
a module board having a first surface, wherein
the first semiconductor memory device and the second semiconductor memory device are arranged on the first surface.

18. A semiconductor module comprising:
a first semiconductor memory device comprising a first electrode;
a second semiconductor memory device comprising a second electrode; and
a reference voltage supplying circuit for supplying a reference potential to the first electrode and the second electrode and for suppressing a noise to be transferred between the first electrode and the second electrode, wherein:
the reference voltage supplying circuit comprises a connection portion and a Thevenin termination portion;
the connection portion is connected between the first reference electrode and the second reference electrode; and
the Thevenin termination portion supplies a reference potential to the first electrode.

* * * * *